United States Patent
Kurosawa

(10) Patent No.: US 9,190,159 B2
(45) Date of Patent: Nov. 17, 2015

(54) SEMICONDUCTOR MEMORY DEVICE

(71) Applicant: Kabushiki Kaisha Toshiba, Minato-ku (JP)

(72) Inventor: Yasuhiko Kurosawa, Fujisawa (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 171 days.

(21) Appl. No.: 13/947,493

(22) Filed: Jul. 22, 2013

(65) Prior Publication Data

US 2014/0269055 A1   Sep. 18, 2014

Related U.S. Application Data

(60) Provisional application No. 61/788,171, filed on Mar. 15, 2013.

(51) Int. Cl.
| | |
|---|---|
| G11C 16/04 | (2006.01) |
| G11C 16/26 | (2006.01) |
| G11C 16/10 | (2006.01) |
| G11C 11/56 | (2006.01) |
| G11C 16/34 | (2006.01) |

(52) U.S. Cl.
CPC ............ *G11C 16/26* (2013.01); *G11C 11/5628* (2013.01); *G11C 16/10* (2013.01); *G11C 16/3404* (2013.01); *G11C 16/349* (2013.01)

(58) Field of Classification Search
USPC ........................................ 365/185.02, 185.24
See application file for complete search history.

(56) References Cited

U.S. PATENT DOCUMENTS

| | | | |
|---|---|---|---|
| 7,864,574 B2* | 1/2011 | Cho et al. ................. | 365/185.03 |
| 7,965,557 B2* | 6/2011 | Kang ........................ | 365/185.18 |
| 8,495,283 B2* | 7/2013 | Park et al. ..................... | 711/103 |
| 8,885,409 B2* | 11/2014 | Lee et al. .................... | 365/185.1 |
| 2004/0170058 A1 | 9/2004 | Gonzalez et al. | |
| 2009/0185417 A1 | 7/2009 | Cho et al. | |
| 2010/0182830 A1 | 7/2010 | Ryu et al. | |
| 2011/0038212 A1 | 2/2011 | Uchikawa et al. | |
| 2013/0070524 A1* | 3/2013 | Dutta et al. .............. | 365/185.03 |
| 2013/0148436 A1 | 6/2013 | Kurosawa | |

FOREIGN PATENT DOCUMENTS

| | | |
|---|---|---|
| JP | 2004-005909 | 1/2004 |
| JP | 2010-170685 | 8/2010 |
| JP | 2011-040137 | 2/2011 |
| JP | 2011-510428 | 3/2011 |
| WO | WO 2009/093786 A1 | 7/2009 |

* cited by examiner

*Primary Examiner* — Pho M Luu
(74) *Attorney, Agent, or Firm* — Oblon, McClelland, Maier & Neustadt, L.L.P.

(57) ABSTRACT

Each memory cell has a threshold voltage to distinguish a storage data item. A controller generates one of storage data items from one or more sets of reception data, stores the storage data item, randomizes data transmission for memory cells, instructs the cells to store the randomized data, uses read voltage candidates to read storage data from the cells, counts a distribution of voltages stored in the cells for each read voltage candidate, specifies a minimum read voltage candidate where a sum of the counting exceeds an expected number, and uses the specified candidate as a read voltage to distinguish a first storage data item corresponding to the expected number and an adjacent second storage data item.

20 Claims, 34 Drawing Sheets

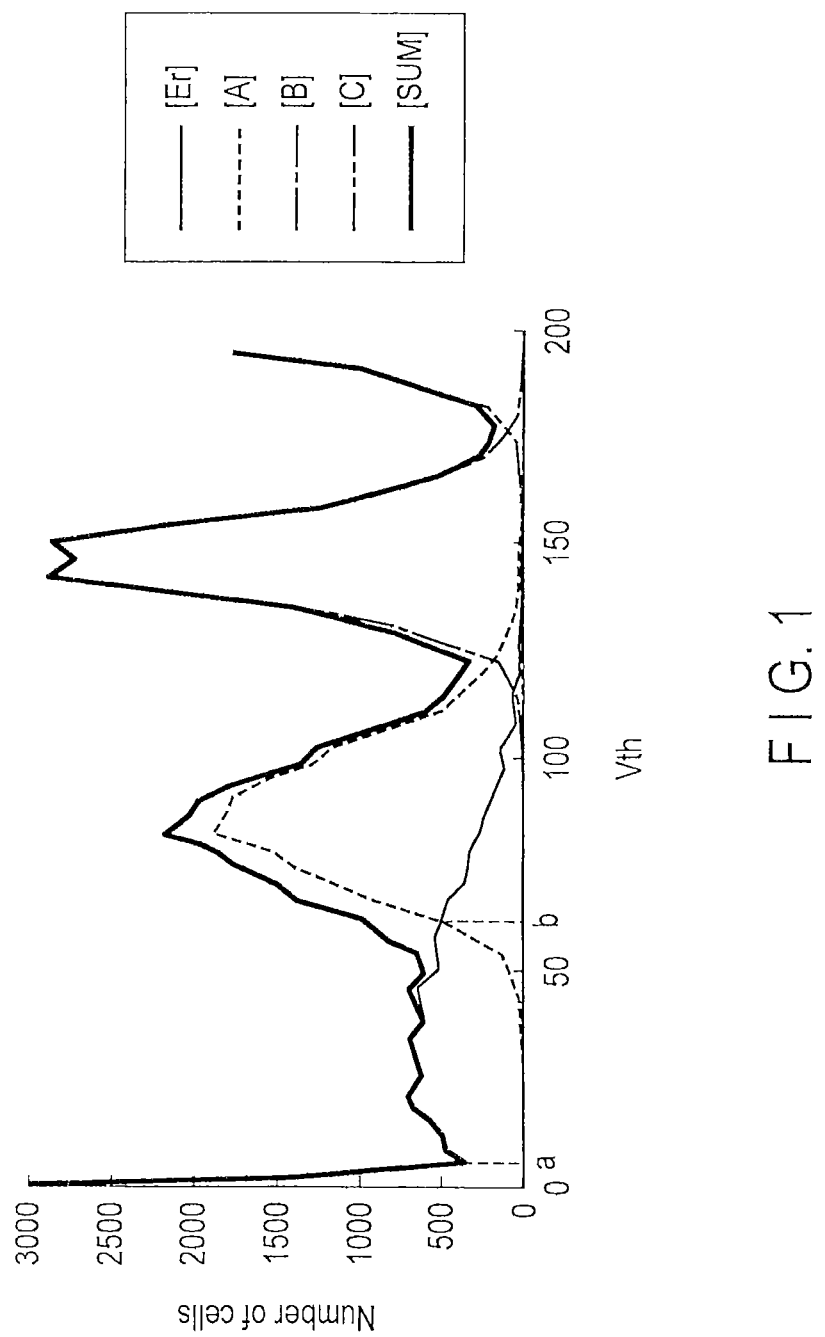
F I G. 1

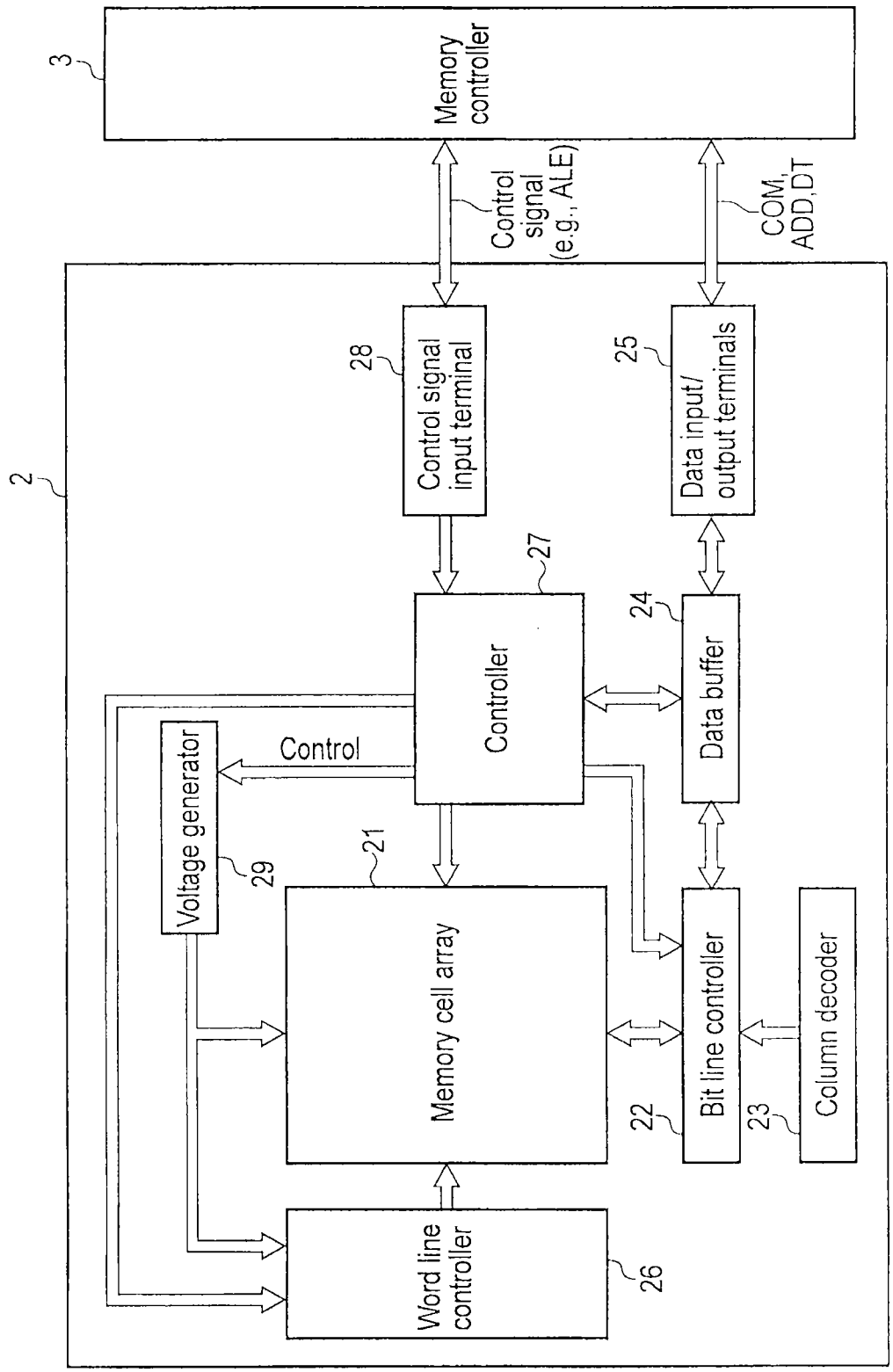
F I G. 3

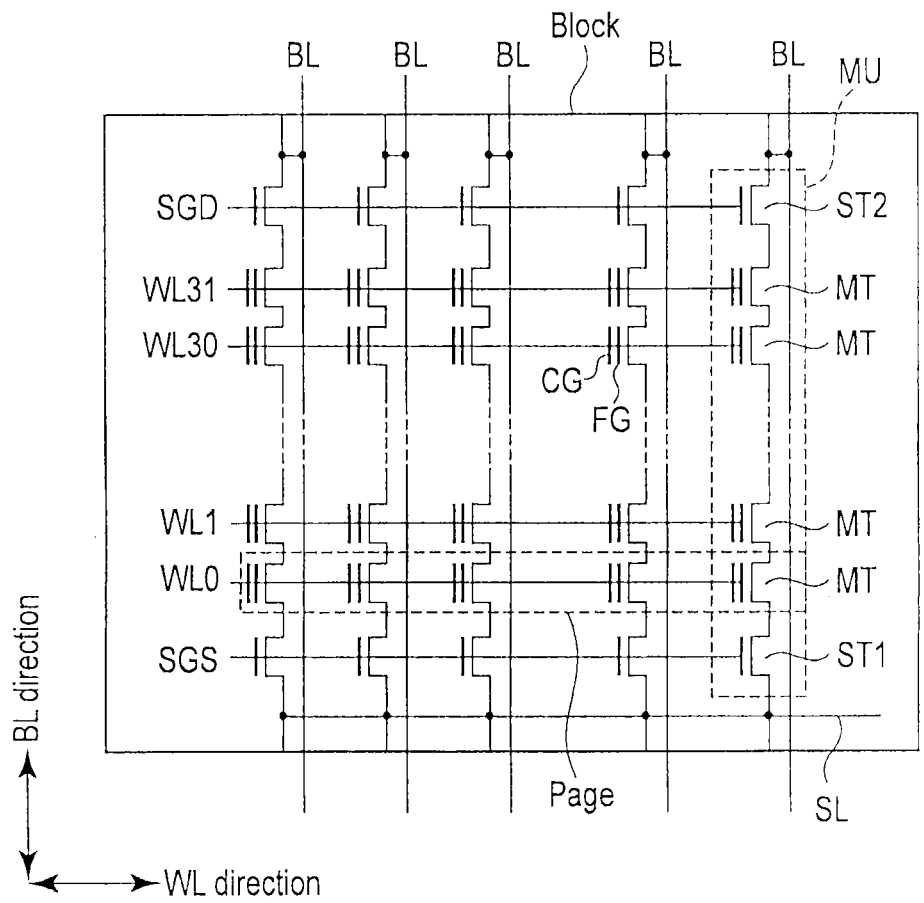
F I G. 4

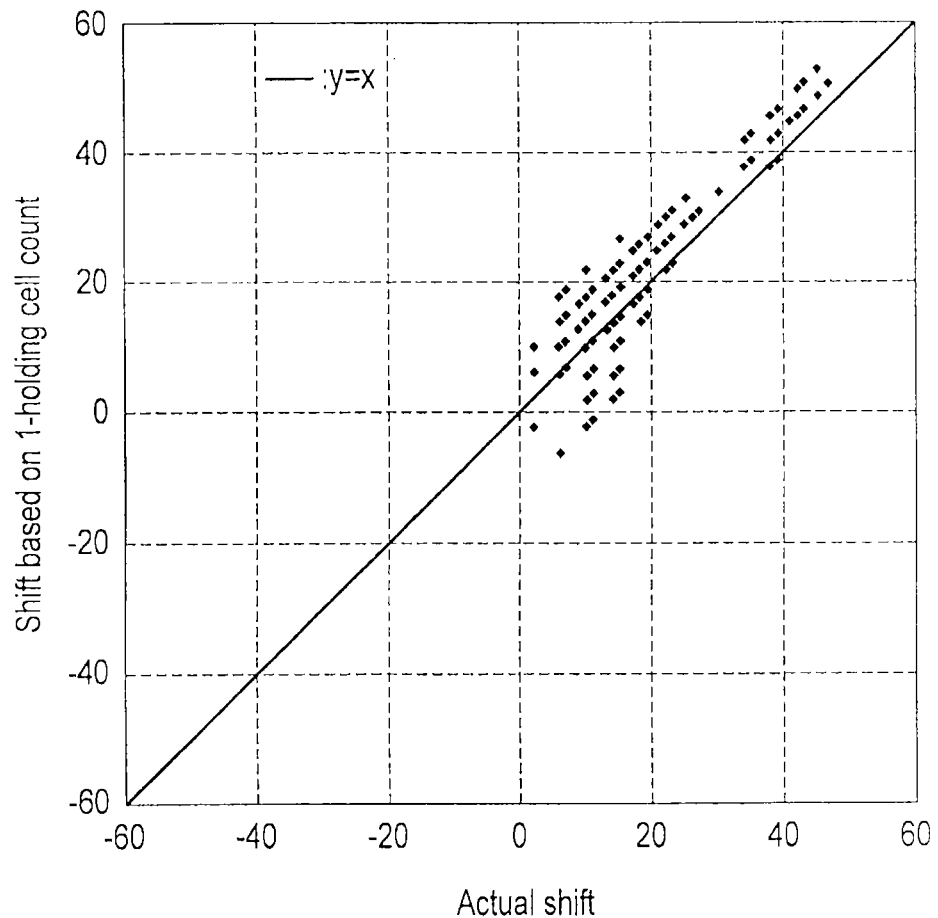
F I G. 12

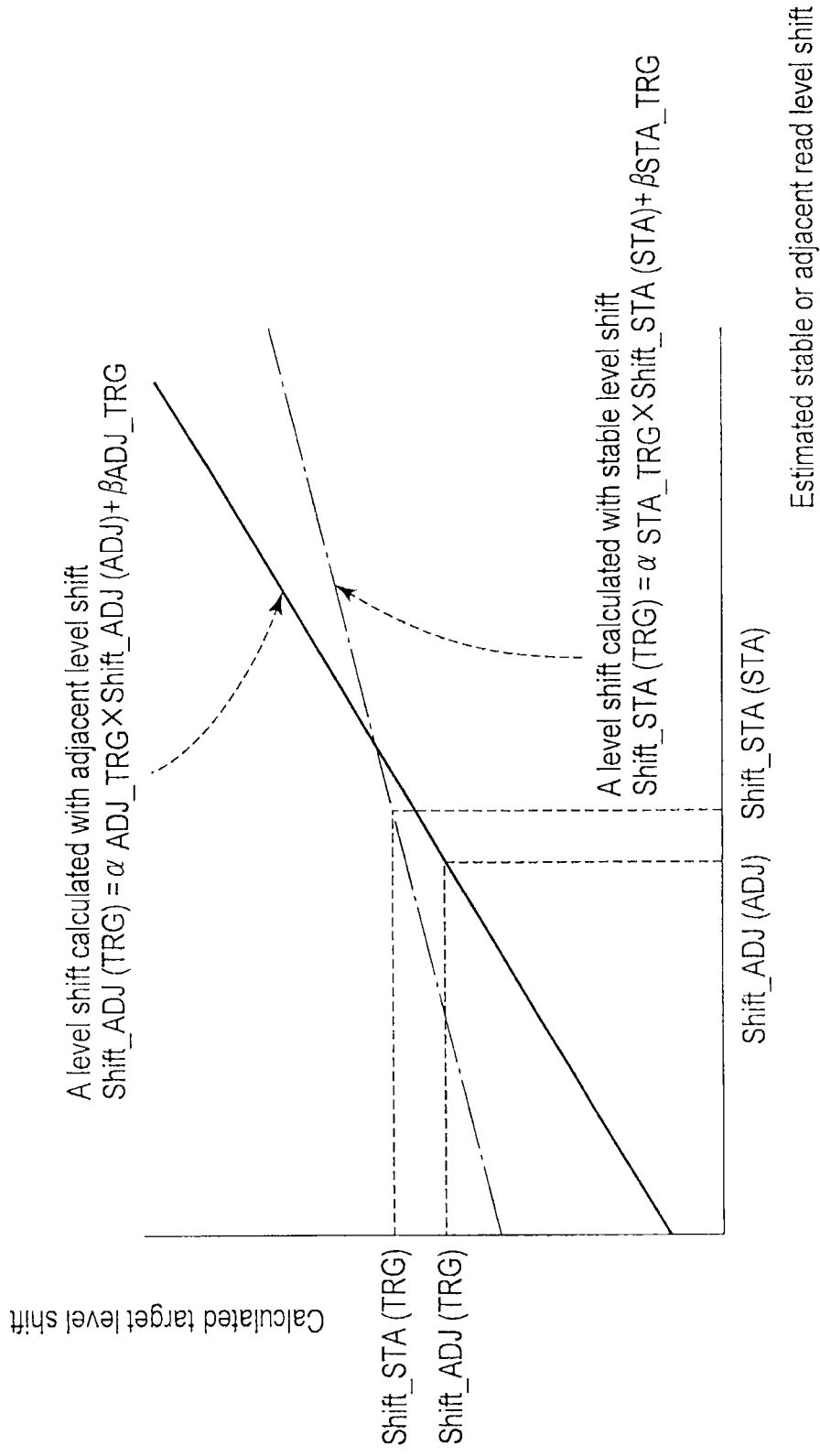
F I G. 14

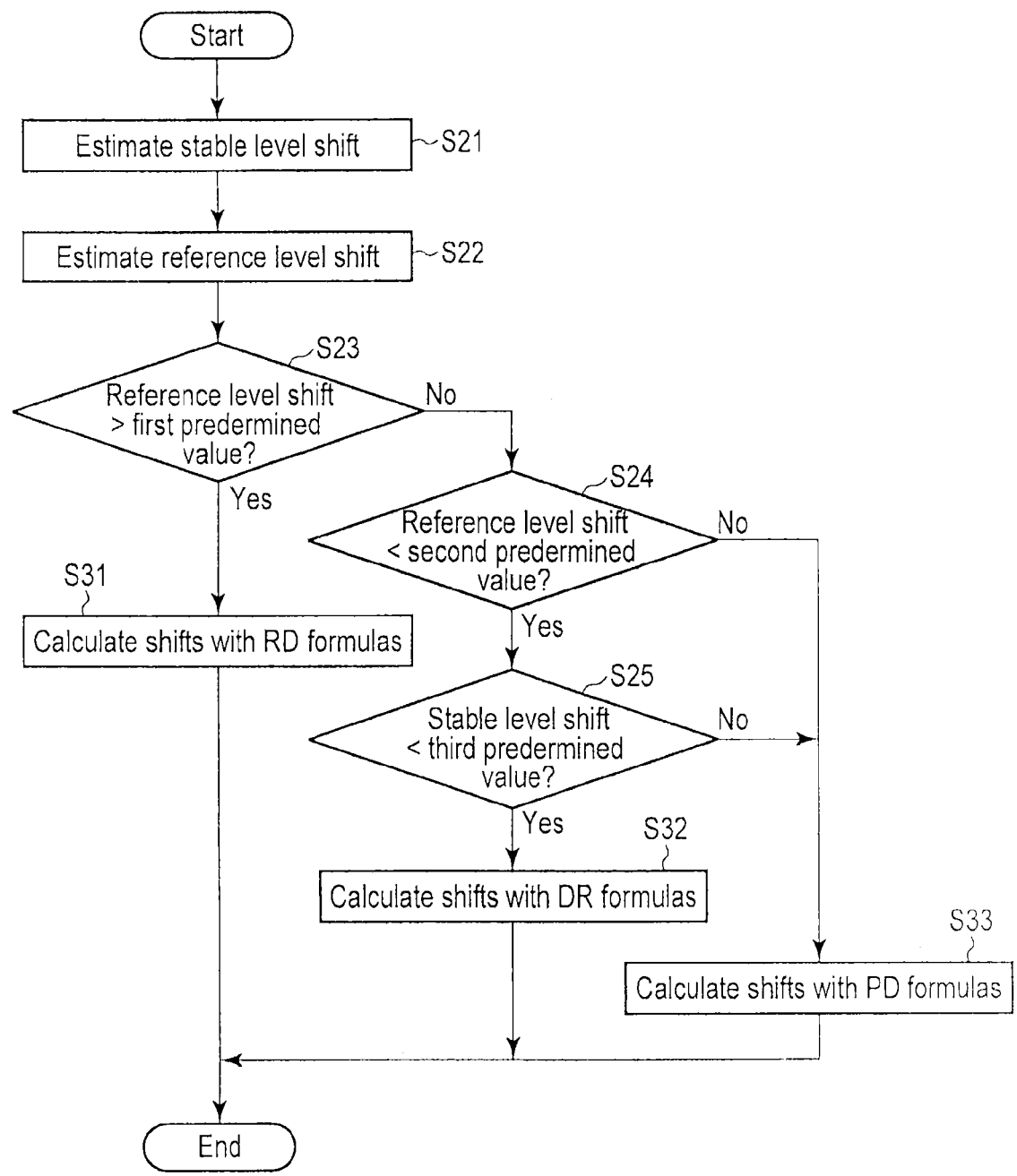
F I G. 19

|  | A | B | C | D | E | F | G |
|---|---|---|---|---|---|---|---|
| Word line B (10) | -6 | -4 | -5 | -3 | -2 | -4 | -3 |
| Word line A (11) | -8 | +5 | -3 | -4 | -2 | -4 | -2 |
| Word line C (12) | -8 | -5 | -4 | -4 | -4 | -5 | -2 |
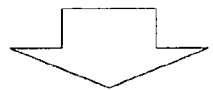
|  | A | B | C | D | E | F | G |
|---|---|---|---|---|---|---|---|
| Word line A (modified) | -7 | -4 | -4 | -3 | -3 | -4 | -2 |
F I G. 21

|  | A | B | C | D | E | F | G |
|---|---|---|---|---|---|---|---|
| Word line B (10) | +8 | +6 | +2 | -1 | -2 | -4 | -3 |
| Word line C (11) | +10 | +8 | +4 | -2 | -1 | -2 | -1 |
| Word line A (12) | -5 | +7 | +3 | -2 | -3 | -3 | -2 |
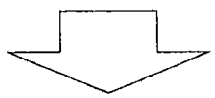
|  | A | B | C | D | E | F | G |
|---|---|---|---|---|---|---|---|
| Word line A (modified) | +9 | +7 | +3 | -1 | -1 | -3 | -2 |
F I G. 22

|  | A | B | C | D | E | F | G |
|---|---|---|---|---|---|---|---|
| Word line A (10) | +5 | +1 | 0 | +2 | +2 | +1 | -10 |
| Word line B (11) | +3 | +2 | +1 | +4 | +3 | +2 | +4 |
| Word line C (12) | +4 | +3 | +2 | +3 | +4 | +3 | +2 |
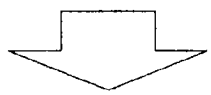
|  | A | B | C | D | E | F | G |
|---|---|---|---|---|---|---|---|
| Word line A (modified) | +3 | +2 | +1 | +3 | +3 | +2 | +3 |
F I G. 23

|  | A | B | C | D | E | F | G |
|---|---|---|---|---|---|---|---|
| Word line B (6) | -6 | -5 | -5 | -2 | -2 | -5 | -2 |
| Word line A (11) | -8 | -7 | +12 | -3 | -4 | -6 | -4 |
| Word line C (21) | -12 | -12 | -10 | -6 | -8 | -8 | -7 |

|  | A | B | C | D | E | F | G |
|---|---|---|---|---|---|---|---|
| Word line A (modified) | -8 | -7 | -6 | -3 | -4 | -6 | -3 |

F I G. 24

|  | A | B | C | D | E | F | G |
|---|---|---|---|---|---|---|---|
| Word line B (3) | -6 | -4 | -5 | -3 | -2 | -4 | -3 |
| Word line A (11) | -8 | +5 | -3 | -4 | -2 | -4 | -2 |
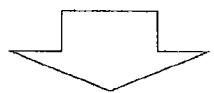
|  | A | B | C | D | E | F | G |
|---|---|---|---|---|---|---|---|
| Word line A (modified) | -6 | -4 | -5 | -3 | -2 | -4 | -3 |
F I G. 25

Block M-1 (119)

|  | A | B | C | D | E | F | G |
|---|---|---|---|---|---|---|---|
| Word lines 0, 85 | +6 | +4 | -3 | -2 | -1 | -2 | -3 |
| Word lines 1, 84 | +8 | +6 | -4 | -3 | -3 | -2 | -4 |
| Word lines 2-83 | +12 | +10 | -6 | -4 | -4 | -4 | -5 |

Block M (120)

|  | A | B | C | D | E | F | G |
|---|---|---|---|---|---|---|---|
| Word lines 0, 85 | +5 | +1 | 0 | +2 | +2 | +1 | +3 |
| Word lines 1, 84 | +3 | +2 | +1 | +4 | +3 | +2 | +4 |
| Word lines 2-83 | +4 | +3 | +2 | +3 | +4 | +3 | +2 |

Block M (121)

|  | A | B | C | D | E | F | G |
|---|---|---|---|---|---|---|---|
| Word lines 0, 85 | -6 | -4 | -5 | -3 | -2 | -4 | -3 |
| Word lines 1, 84 | -8 | -5 | -3 | -4 | -2 | -4 | -2 |
| Word lines 2-83 | -8 | -5 | -4 | -4 | -4 | -5 | -2 |

F I G. 26

Values for adjustment

|              | A  | B  | C  | D  | E  | F  | G  |
|--------------|----|----|----|----|----|----|----|
| Word lines 0, 85 | -6 | -6 | +3 | +2 | +3 | +2 | +2 |
| Word lines 1, 84 | -4 | -4 | +2 | +1 | +1 | +2 | +1 |

Shifts for word lines 2-83

|           | A   | B   | C  | D  | E  | F  | G  |
|-----------|-----|-----|----|----|----|----|----|
| Block 0   | +5  | +1  | 0  | +2 | +2 | +1 | +3 |
| ...       |     |     |    |    |    |    |    |
| Block 119 | +4  | +3  | +2 | +3 | +4 | +3 | +2 |
| Block 120 | +12 | +10 | -6 | -4 | -4 | -4 | -5 |
| Block 121 | -8  | -5  | -4 | -4 | -4 | -5 | -2 |
| ...       |     |     |    |    |    |    |    |

F I G. 27

Values for adjustment

|  | A | B | C | D | E | F | G |
|---|---|---|---|---|---|---|---|
| DR: Word lines 0, 85 | -6 | -6 | +3 | +2 | +3 | +2 | +2 |
| DR: Word lines 1, 84 | -4 | -4 | +2 | +1 | +1 | +2 | +1 |
| PD: Word lines 0, 85 | -3 | -2 | +1 | +2 | +3 | +3 | +2 |
| PD: Word lines 1, 84 | -2 | -1 | 0 | 0 | +1 | +1 | +1 |
| RD: Word lines 0, 85 | +5 | +4 | +2 | -1 | -2 | -2 | -3 |
| RD: Word lines 1, 84 | +3 | +2 | +1 | 0 | 0 | -1 | -2 |

Shifts for word lines 2-83

|  | A | B | C | D | E | F | G |
|---|---|---|---|---|---|---|---|
| Block 0 | +5 | +1 | 0 | +2 | +2 | +1 | +3 |
| ... | | | | | | | |
| Block 119 | +4 | +3 | +2 | +3 | +4 | +3 | +2 |
| Block 120 | +12 | +10 | -6 | -4 | -4 | -4 | -5 |
| Block 121 | -8 | -5 | -4 | -4 | -4 | -5 | -2 |
| ... | | | | | | | |

F I G. 28

| | A | B | C | D | E | F | G |
|---|---|---|---|---|---|---|---|
| Estimated shift | -16 | -18 | +25 | -20 | -18 | -17 | -19 |

⇒

| | A | B | C | D | E | F | G |
|---|---|---|---|---|---|---|---|
| Calculated shift | +18 | +4 | -19 | +3 | -19 | -18 | -17 |
| Difference between estimated and calculated shifts | +2 | +22 | +44 | +23 | +1 | +1 | +2 |

⇒

| | A | B | C | D | E | F | G |
|---|---|---|---|---|---|---|---|
| Modified shift | -16 | -18 | -19 | -20 | -18 | -17 | -19 |
| Calculated shift with modified shifts | -18 | -17 | -19 | -18 | -19 | -18 | -17 |
| Difference between estimated and modified calculated shifts | +2 | +1 | 0 | +2 | +1 | +1 | +2 |

FIG. 29

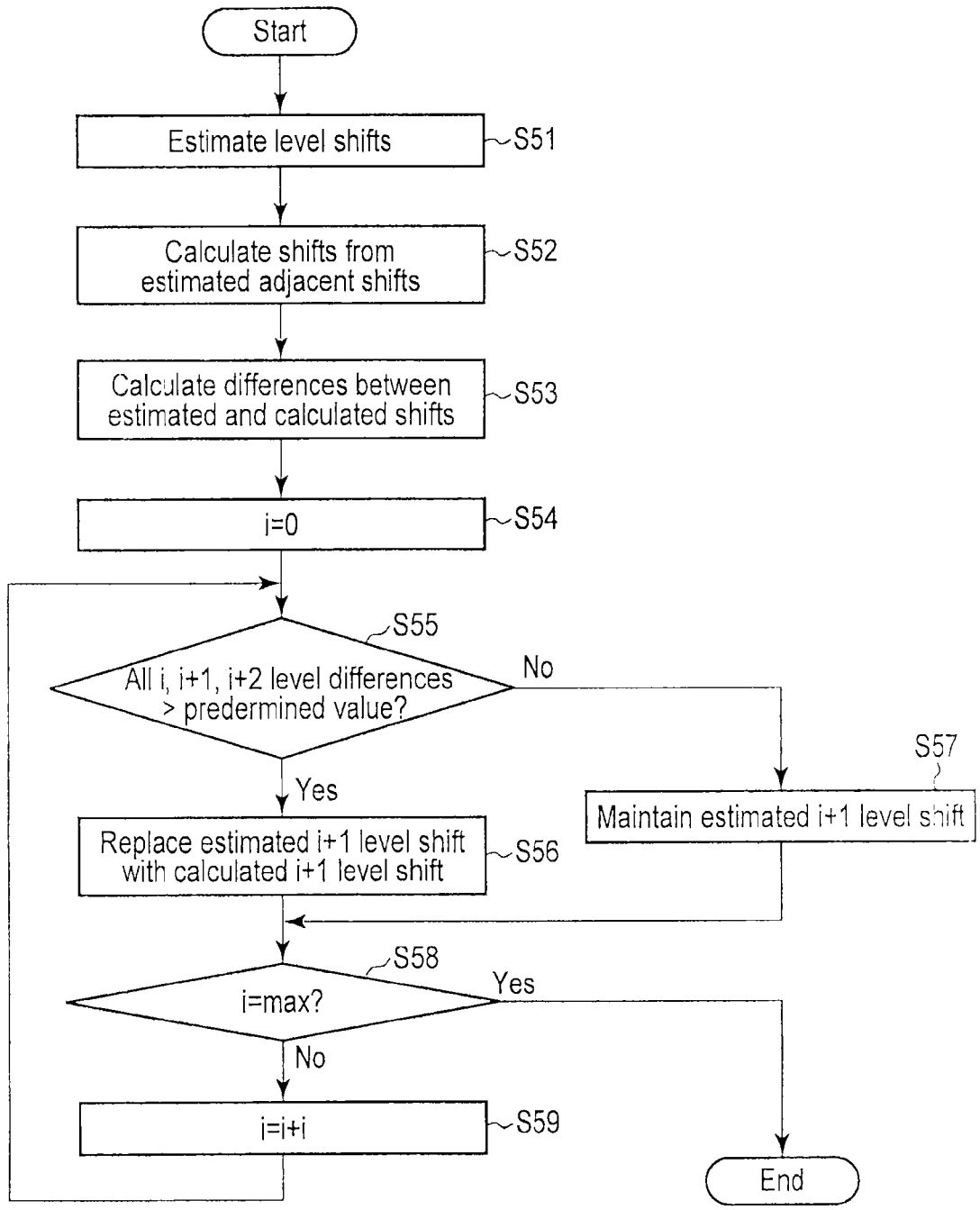
F I G. 30

| | A | B | C | D | E | F | G |
|---|---|---|---|---|---|---|---|
| Estimated shift | -16 | -18 | +25 | +20 | -18 | -17 | -19 |

⇒

| | A | B | C | D | E | F | G |
|---|---|---|---|---|---|---|---|
| Calculated shift | -18 | +4 | +1 | +3 | +1 | -18 | -17 |
| Difference between estimated and calculated shifts | +2 | +22 | +24 | +23 | +19 | +1 | +2 |

⇒

| | A | B | C | D | E | F | G |
|---|---|---|---|---|---|---|---|
| Modified shift | -16 | -18 | -18 | -18 | -18 | -17 | -19 |
| Calculated shift with modified shifts | -18 | -17 | -18 | -18 | -17 | -18 | -17 |
| Difference between estimated and modified calculated shifts | +2 | +1 | 0 | 0 | +1 | +1 | +2 |

F I G. 31

|  | A | B | C | D | E | F | G |
|---|---|---|---|---|---|---|---|
| Estimated shift | +5 | +4 | +2 | +2 | 0 | +2 | -22 |

|  | A | B | C | D | E | F | G |
|---|---|---|---|---|---|---|---|
| Calculated shift | +4 | +3 | +3 | +1 | +2 | -10 | +2 |
| Difference between estimated and calculated shifts | +1 | +1 | -1 | +1 | -2 | +12 | -24 |

|  | A | B | C | D | E | F | G |
|---|---|---|---|---|---|---|---|
| Modified shift | +5 | +4 | +2 | +2 | 0 | +2 | +2 |
| Calculated shift with modified shifts | +4 | +3 | +3 | +1 | +2 | +1 | +2 |
| Difference between estimated and modified calculated shifts | +1 | +1 | +1 | +1 | +2 | +1 | 0 |

F I G. 33

|  | A | B | C | D | E | F | G |
|---|---|---|---|---|---|---|---|
| Estimated shift based on relative minimum | -8 | +10 | +1 | -3 | -2 | -1 | -3 |
| Estimated shift based on 1-holding cell count | +14 | +9 | +2 | -6 | -2 | -3 | -1 |

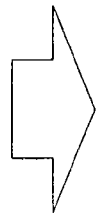

|  | A | B | C | D | E | F | G |
|---|---|---|---|---|---|---|---|
| Calculated shift based on relative minimum | +10 | -3 | +3 | 0 | -2 | -2 | -1 |
| Calculated shift based on 1-holding cell count | +9 | +8 | +1 | 0 | -4 | -1 | -3 |

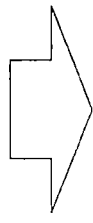

|  | A | B | C | D | E | F | G |
|---|---|---|---|---|---|---|---|
| Difference between estimated and calculated shifts based on relative minimum | +18 | +13 | +2 | +3 | 0 | +1 | +2 |
| Difference between estimated and calculated shifts based on 1-holding cell count | +5 | +1 | +1 | -6 | +2 | +2 | +2 |
| Selected shift | +14 | +9 | +2 | -3 | -2 | -1 | -3 |

F I G. 36

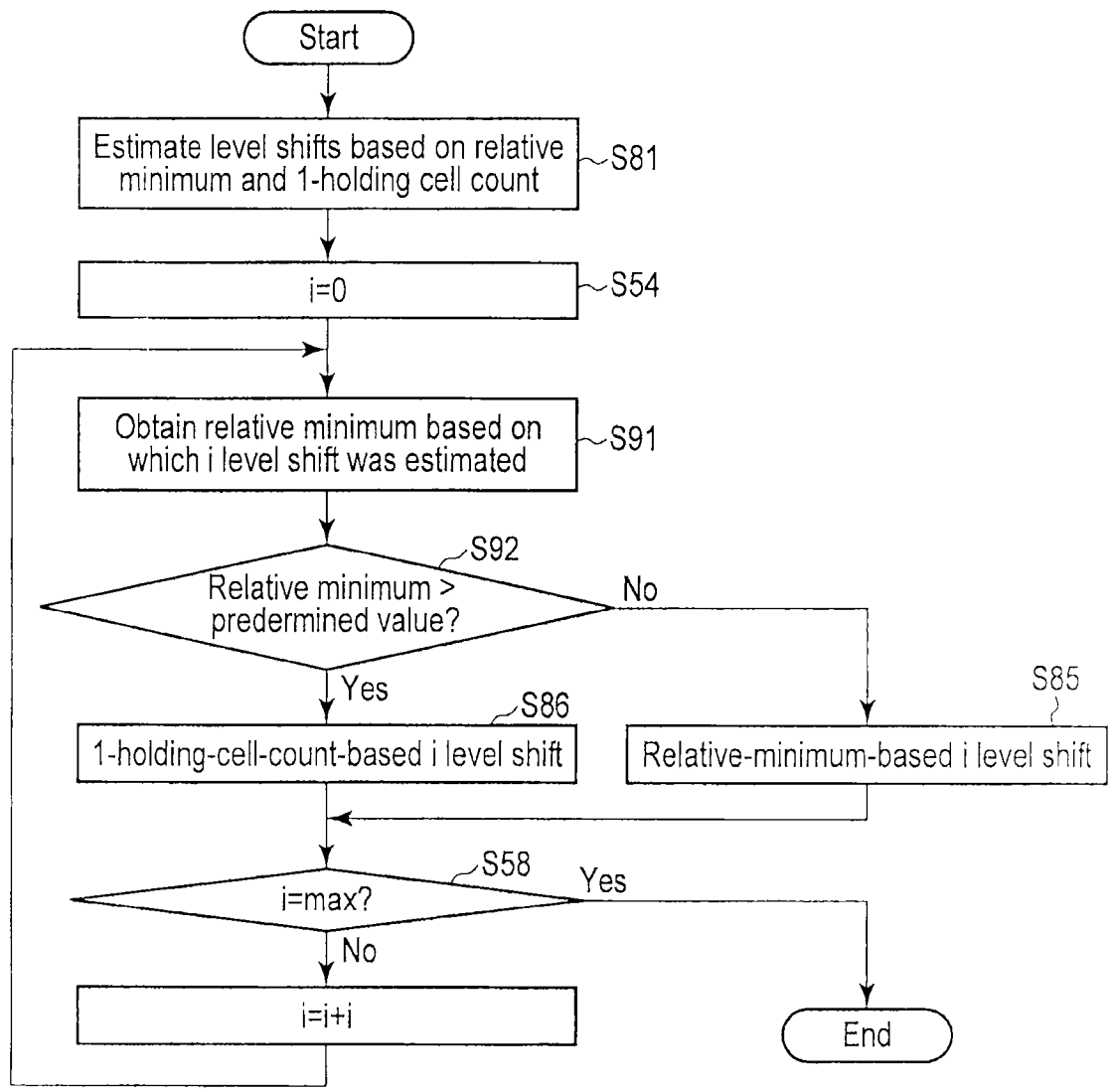
F I G. 37

SEMICONDUCTOR MEMORY DEVICE

CROSS-REFERENCE TO RELATED APPLICATIONS

This application claims the benefit of U.S. Provisional Application No. 61/788,173, filed Mar. 15, 2013, the entire contents of which are incorporated herein by reference.

FIELD

Embodiments described herein relate generally to a semiconductor memory device.

BACKGROUND

The threshold voltages of cell transistors in NAND flash memories may vary over time after a data write.

BRIEF DESCRIPTION OF THE DRAWINGS

FIG. 1 illustrates simulation results of a distribution read.

FIG. 3 is a block diagram of a memory of the first embodiment.

FIG. 4 is a circuit diagram of an example block.

FIG. 12 illustrates a relationship between actual shifts of a read level and shifts based on the number of 1-holding memory cells.

FIG. 14 illustrates read level shift calculation according to the second embodiment.

FIG. 19 is a flowchart of read level shift estimation according to a third embodiment.

FIG. 21 illustrates a first example of read level shift estimation according to a fourth embodiment.

FIG. 22 illustrates a second example of read level shift estimation according to the fourth embodiment.

FIG. 23 illustrates a third example of read level shift estimation according to the fourth embodiment.

FIG. 24 illustrates a fourth example of read level shift estimation according to the fourth embodiment.

FIG. 25 illustrates a fifth example of read level shift estimation according to the fourth embodiment.

FIG. 26 illustrates a first example of a control table of shifts according to a fifth embodiment.

FIG. 27 illustrates a second example of a control table of shifts according to the fifth embodiment.

FIG. 28 illustrates a third example of a control table of shifts according to the fifth embodiment.

FIG. 29 illustrates data obtained in a first example read level shift estimation according to a sixth embodiment.

FIG. 30 is a flowchart of a first example of read level shift estimation according to the sixth embodiment.

FIG. 31 illustrates data obtained in a second example of read level shift estimation according to the sixth embodiment.

FIG. 33 illustrates data obtained in a third example of read level shift estimation according to the sixth embodiment.

FIG. 36 illustrates data obtained in read level shift estimation of the seventh embodiment.

FIG. 37 is a flowchart of a second example of read level shift estimation according to the seventh embodiment.

DETAILED DESCRIPTION

Figure 2:
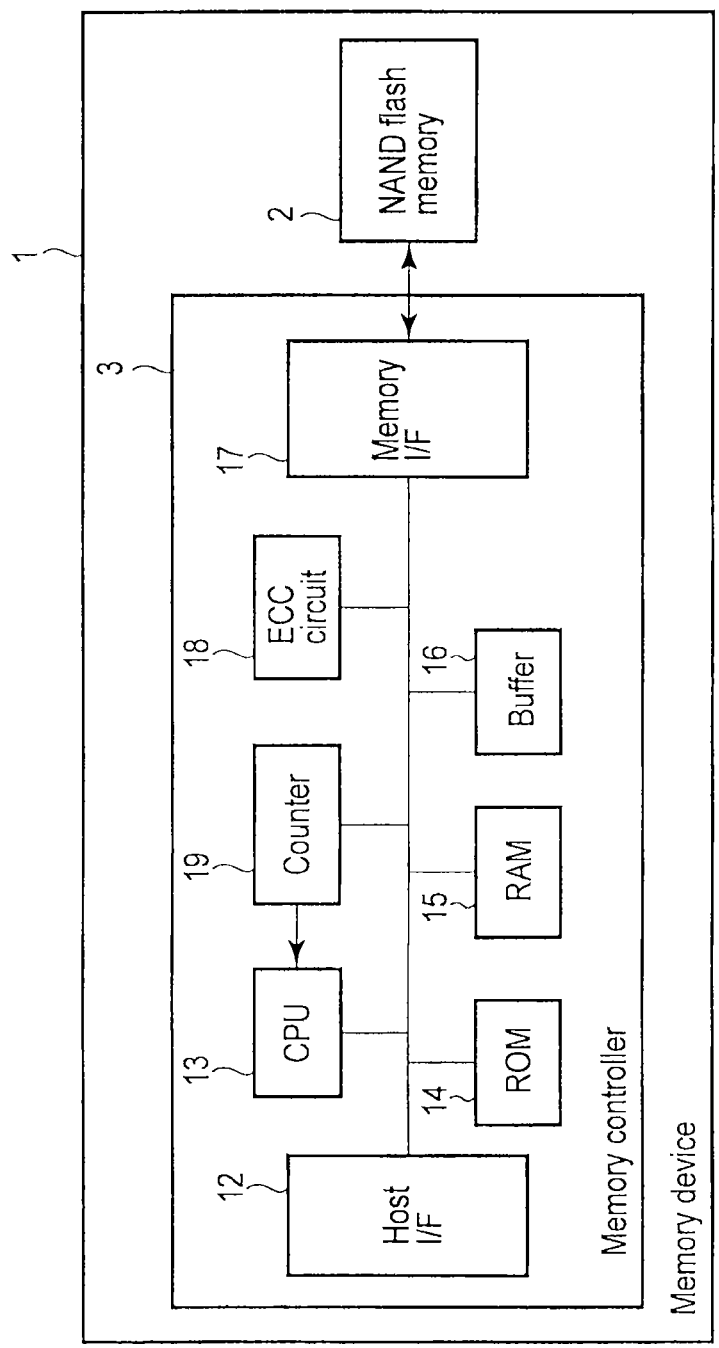
FIG. 2 is a block diagram of a memory device according to a first embodiment.

In general, according to one embodiment, a semiconductor memory device includes memory cells and a controller. Memory cells each has a threshold voltage to distinguish a storage data item stored. The controller is configured to: generate one of different storage data items from one or more sets of reception data, store the one of the different storage data items, randomize data transmission for the memory cells, transmit the randomized transmission data to the memory cells, instruct the memory cells to store the randomized transmission data, use read voltage candidates to read storage data from the memory cells, count a distribution of voltages stored in the memory cells for each read voltage candidate, specify a minimum one of read voltage candidates where a sum of the counting exceeds an expected number, and use the specified read voltage candidate as a read voltage to distinguish a first storage data item of the storage data items corresponding to the expected number and an adjacent second storage data item.

Techniques for storing data of two or more bits in a memory cell are known. Such a multi-level data holding technique may also be applied to the NAND flash memories. In a multi-level NAND flash memory, a memory cell transistor can have one of multiple threshold voltages. A threshold voltage according to data to be stored is given to a cell transistor. For example, in order to store three-bit data in each memory cell, one of eight threshold voltages is given to each cell transistor. For a data read, determination of whether the threshold voltage of a cell transistor exceeds a particular read voltage is used. Threshold voltages of cell transistors, however, vary with use and the form of their distribution also varies. Changes in the threshold voltages of the cell transistors affect the original relationship between the threshold voltages of the cell transistor and read voltages. This results in erroneous reads.

In order to address the read error, optimum read voltages to minimize read errors are estimated. Thus, estimated read voltages are used instead of the original read voltages. The estimated read voltages are shifted from the respective original read voltages. A series of operations to estimate an optimum read voltage involves a distribution read. In general, the distribution read is implemented in the NAND flash memories. The distribution read involves repeated reads with read voltages varied by a fixed quantity. While the distribution read is being executed, some techniques and criteria are used to estimate the optimum read voltage.

In the distribution read, multiple voltages are used as candidates to count data items exceeding each read voltage candidate, i.e., 1 data. Then, a histogram is generated in accordance with differences in the 1-data count. Specifically, differences between the count for a particular candidate read voltage and that for an adjacent candidate read voltage are calculated, and this calculation is executed for each candidate read voltage. Then, threshold voltage (level) is plotted on the horizontal axis and the count difference is plotted on the vertical axis to obtain a histogram. Local minimums of the obtained histogram are estimated to be optimum read voltages. Distributions of the number of data items with corresponding respective threshold voltages do not spread much, and a read voltage can be estimated with such a method within a range where a distribution can be considered to be a normal distribution.

However, a distribution of threshold voltages of memory cells holding a particular data level may deform to have a long skirt at either side. This may result in the optimum read voltage absorbed by the distribution for another data level. In such a case, slight differences in conditions for the distribution read may greatly vary an estimated local minimum in every execution of distribution read. Moreover, a local minimum may shift from the optimum read voltage greatly. A shift may even occur in the direction opposite the intended one. FIG. 1 is a simulation result illustrating such a case. As illustrated in FIG. 1, the distribution for Er level of an eight-level NAND flash memory has a long skirt, and overlaps with the distribution for A level. The Er and A levels as well as B and C levels in the figure are of eight-levels of data as will be fully described later. The overlap results in the distributions combined to be a curve for the sum. Note that which cells have Er or A level in the simulation is known and therefore also the curves for Er and A levels as illustrated in FIG. 1 is also known; however an actual distribution read can only generate the sum curve. The local-minimum-based estimation indicates that A read voltage to determine Er or A level is "a". In contrast, the actual optimum read voltage is the intersection of the curves for Er and A level, which is "b". Thus, the estimated read voltage is greatly shifted from the optimum read voltage. Thus, read voltages may not be correctly estimated through search of the local minimums.

Embodiments will now be described with reference to the figures. Components with substantially the same functionality and configuration will be referred to with the same reference numbers and duplicate descriptions will be made only when required. Moreover, description for a particular embodiment is applicable to other embodiments. Note that the figures are schematic. Moreover, each embodiment described below is only used to illustrate a device and/or method to implement a technical idea of this embodiment, which is not limited to the following examples. Moreover, each functional block may be implemented as hardware, computer software, or a combination of both. For this reason, in order to clearly illustrate this interchangeability of hardware and software, descriptions will be made in terms of their functionality in general. Those skilled in the art may implement the functional blocks in varying ways for each particular application, but any implementation approach is included in the scope of the embodiments. Moreover, it is not essential that each functional block is distinguished as in the following examples. For example, some of the functions may be implemented by functional blocks different from those illustrated below. Furthermore, an illustrated functional block may be divided into functional sub-blocks.

First Embodiment

FIG. 2 is a block diagram of a memory device according to the first embodiment. A memory device includes a semiconductor memory 2 and a memory controller 3. The memory device 1 may be an SD card. The memory device 1 communicates with a host device (not shown).

The memory controller 3 receives a write command, a read command, and an erase command from, for example, a host device, and accesses the memory 2 in accordance with a received command. The memory controller 3 includes a host interface (I/F) 12, a central processing unit (CPU) 13, a read only memory (ROM) 14, a random access memory (RAM) 15, a buffer 16, a memory interface 17, an error correction circuit (ECC circuit) 18, and a counter 19. They are coupled by a bus.

The host interface 12 allows the memory device 1 to be interfaced with a host device. The CPU 13 manages the entire operation of the memory device 1 in accordance with control programs. The ROM 14 stores firmware, such as control programs used by the CPU 13. The RAM 15 is used as a work area for the CPU 13, and stores control programs and various kinds of tables, etc. The buffer 16 temporarily stores data transmitted from the host device, data read from the memory 2, or intermediate data as a result of a randomize process, ECC-coding, or ECC correction. Only one buffer 16 is illustrated in the figure; however multiple buffers may be used, in accordance with the usage or design restrictions. The memory interface 17 allows the memory controller 3 to be interfaced with the memory 2. The ECC circuit 18 corrects errors in data read from the memory 2, and adds codes for error correction to data to be written in the memory 2. The counter 19 is used to count 1-data or 0-data included in data read from the memory 2 to determine a histogram of threshold voltage distribution during execution of the distribution read, which will be described later.

FIG. 3 is a block diagram of the memory of the first embodiment. The memory 2 may be a NAND flash memory. As shown in FIG. 3, the memory 2 includes a memory cell array 21, a bit line controller 22, a column decoder 23, a data buffer 24, data input/output terminals 25, a word line controller 26, a controller 27, a control signal input terminal 28, and the voltage generator 29. The memory 2 can store data which consists of two or more bits per memory cell. The description will be given of an example of storing data indicative of one of eight levels with three bits by each memory cell. The first embodiment is, however, also applicable to levels of more or less than eight levels.

The memory cell array 21 includes blocks, word lines, bit lines, a source line, etc. As shown in FIG. 4, a block includes memory cell columns MU. A memory cell column MU includes cell transistors MT coupled in series, and select transistors ST1 and ST2 coupled to this serial structure. The transistor ST1 is coupled to the source line and the transistor ST2 to a corresponding bit line BL. The memory cell array 21 erases data per block.

Each cell transistor MT has a tunnel insulator, a charge storage layer, an intermediate insulator, and a control electrode (word line) stacked on a wall in a semiconductor substrate, and source/drain areas. Each cell transistor MT has a threshold voltage variable in accordance with the number of the electrons in the charge storage layer to store data corresponding to one of the eight levels in accordance with the threshold voltage. Control electrodes of cell transistors MT belonging to the same row are coupled to the same word line WL. The memory space of cell transistors MT coupled to the same word line WL form pages. The memory cell array 21 reads and writes data per page.

The transistors ST1 and ST2 each includes a gate insulator and a gate electrode stacked on the semiconductor substrate, and source/drain areas. Gates of transistors ST1 belonging to the same row are coupled to a select gate line SGS. Gates of transistors ST2 belonging to the same row are coupled to a select gate line SGD.

Referring back to FIG. 3, the bit line controller 22 reads data of the memory cells through the bit lines BL and detects the state of the memory cells through the bit lines BL. The bit line controller 22 applies write (program) voltages to the memory cells through the bit lines BL to write (program) data in the memory cells. The bit line controller 22 includes components, such as sense amplifiers and data storage circuits (not shown). The sense amplifier amplifies potentials on the bit lines BL. A particular data storage circuit is selected by the column decoder 23. Data read to the selected data storage circuit from the memory cells is output to outside the memory 2 from the data input/output terminals 25 through the data buffer 24.

The data input/output terminals 25 are coupled to the memory controller 3. The data input/output terminals 25 receive various types of command COM which control operation of the memory 2, an address ADD, and data DT from the external memory controller 3, and receive data DT or output data DT to the external memory controller 3. Write data DT input to the data input/output terminals 25 is supplied to a particular selected data storage circuit via the data buffer 24. The command COM and address ADD are supplied to the controller 27.

The word line controller 26 receives from the voltage generator 29 voltages required for reads, writes, or erases. The word line controller 26 applies received voltages to selected word lines WL in accordance with control of the controller 27.

The controller 27 controls the memory cell array 21, bit line controller 22, column decoder 23, data buffer 24, word line controller 26, and voltage generator 29. The controller 27 is coupled to the control signal input terminal 28, and is controlled by control signals input from outside through the control signal input terminal 28, such as an address latch enable (ALE), a command latch enable (CLE), a write enable (WE), and a read enable (RE).

The voltage generator 29 provides voltages to the memory cell array 21 and word line controller 26 in accordance with control of the controller 27 during operations such as a write, read, and erase. Specifically, the voltage generator 29 generates voltages VPGM, VPASS, and VISO during data writes, and a voltage VERA during data erases.

The voltage generator 29 also generates a voltage VREAD and various read voltages during a data read. The eight levels of data are referred to as an erase (Er) level, A level, B level, C level, D level, E level, F level, and G level in ascending order of their threshold voltages. Hereinafter, the erase level, A level, B level, C level, D level, E level, F level, or G level may be referred to as a data level. Though memory cells are written in an attempt to have the same threshold voltages, the threshold voltages in fact vary because of variation in properties of the memory cells. As a result, there is a distribution in the threshold voltages for each data level. In order to determine A level to G level of data, respective read levels (voltages) are necessary. Each read level is ideally smaller than the minimum threshold voltage of the corresponding data level and larger than the maximum threshold voltage of the data level smaller by one level. Then, each read level is used to distinguish the two data levels at its both sides. In order to distinguish eight data items, seven read levels are necessary, and they are referred to as A read level to G read level, respectively. For example, the A read level is used to distinguish two adjacent Er and A levels. The voltage VREAD turns on the cell transistors regardless of their threshold voltages.

The controller 27 also uses digital data to control voltage generation by the voltage generator 29. The voltage generator 29 has a digital-to-analog converter, which receives digital data from the controller 27. The voltage generator 29 generates various voltages in accordance with the digital data. The digital data includes that for various uses such as for read voltages. The digital data is stored, for example, in a control-data-storage area in the memory cell array 21. The digital data is preset, and transferred to a register (not shown) from the memory cell array 21 upon power-on. The digital data is described with a unit of DAC in the following. The digital data includes various values such as initial values for distribution reads, which will be described later.

The controller 27 can also add a positive or negative adjustment to digital data to generate adjusted digital data. For example, the controller 27 adds an adjustment to digital data for generating a particular read voltage to generate an adjusted read level. Specifically, default values of read levels are stored in the memory 2 in a nonvolatile manner using digital data, for example. Then, the controller 27 adds an obtained shift (also in DAC unit) to a default to generate corresponding digital data corresponding to a read level. The controller 27 supplies the value specified with the obtained digital data obtained to the voltage generator 29, which in turn generates the specified read level.

The memory 2 may be a so-called three-dimensional memory with BiCS techniques, or a BiCS memory.

Some memory controllers receive data to be written from outside, and store such with bits thereof rearranged. During a data read, the rearranged bits are restored to the original order and then output from the memory.

The memory controller 3 supports data randomization as one of techniques to improve the reliability of data stored in the memory 2. The randomization of to-be-written data is executed by the memory controller 3, especially part of the ECC circuit 18 therein, another dedicated circuit (not shown), or the CPU 13, for example. For example, the randomization circuit generates random numbers, and when it receives write data from another device (for example, a host device), it executes logical operations (for example, the exclusive OR) of a bit in the write data and a bit in the generated random number corresponding to the bit in the write data. The memory 2 stores this logically-operated data. During a data read, the memory controller 3 reads the logically-operated data from the memory 2, restores it to pre-logical-operation write-data, and outputs it to the host device.

Randomization may be executed with another approach. For example, a randomization circuit may rearrange bits in the write data received from the host device, and instruct the memory 2 to rearrange the bits. The memory 2 stores the write data with its bits rearranged. During a data read, the randomization circuit outputs the bits rearranged in their original order to the host device. Alternatively, the memory may randomize received data, store the data, restore the data to the original form, and output it.

Figure 5:
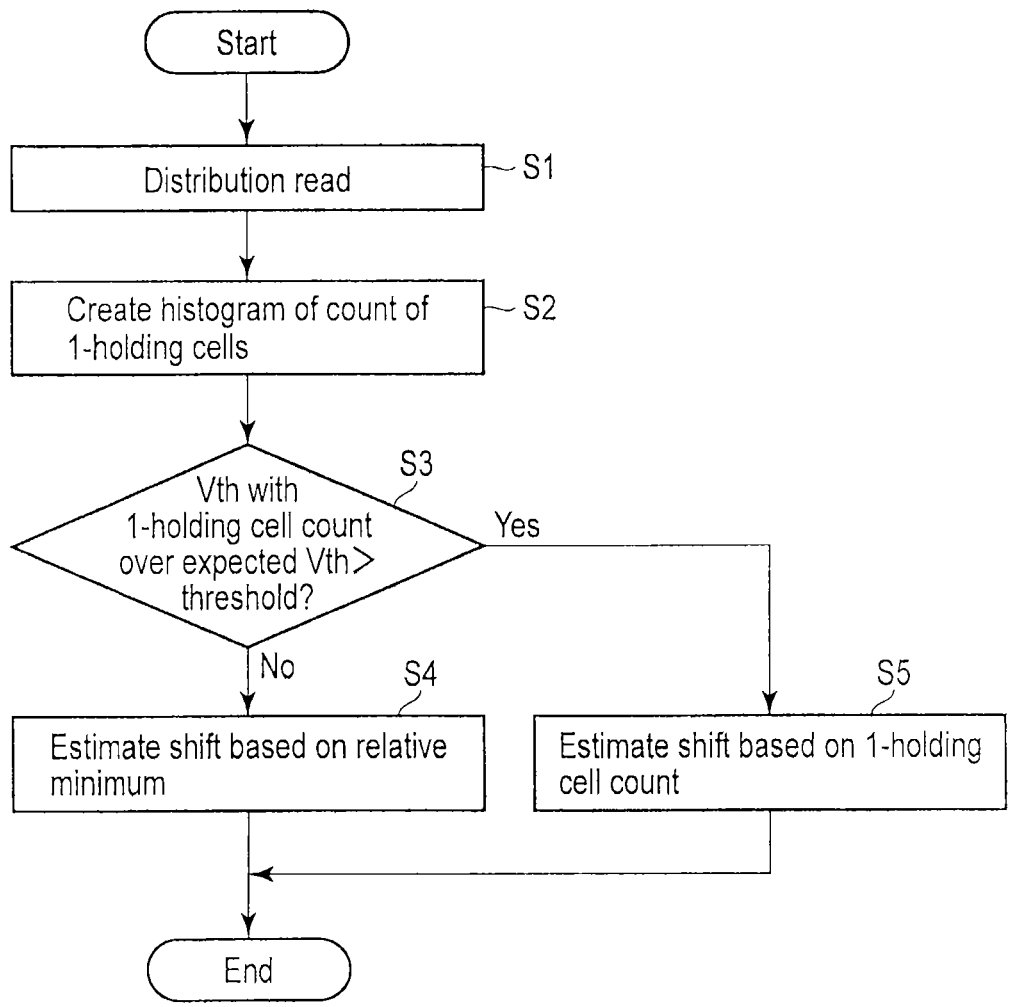
FIG. 5 is a flowchart of read level shift estimation according to the first embodiment.

Referring now to FIGS. 5 to 12, read level estimation by the memory device according to the first embodiment will be described. FIG. 5 illustrates the flow of estimation of a shift of a read level according to the first embodiment. The read level estimation through distribution read is started with an instruction from the memory controller 3 when, for example, the memory controller 3 determines that errors of data received from the memory 2 are beyond the error correction capability of the ECC circuit 18. The memory controller 3 is configured to execute the flow of FIG. 5. FIG. 5 illustrates the flow for estimation of a particular read level.

Figure 6:
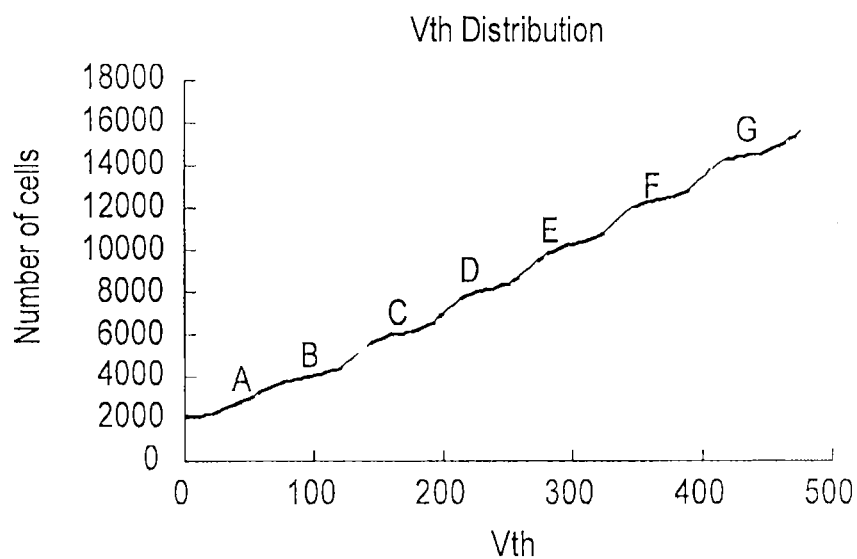
FIG. 6 illustrates an example relationship between threshold voltages and the number of 1-holding memory cells in the first embodiment.

In step S1, the memory controller 3 executes a distribution read associated with the read level to be estimated. Specifically, the memory controller 3 instructs the memory 2 to execute the distribution read. Instructions of a distribution read are accompanied with its target, a start level, etc. Upon reception of the instructions, the controller 27 uses the start level as a read level to read data from the memory cells targeted for the distribution read in the binary mode. The memory controller 3 counts and stores the number of the memory cells holding 1-data read through the counter 19. The memory controller 3 then executes this counting of 1-data holding memory cells with a read level larger than the start level by a predetermined step width. Similarly, the memory controller 3 repeats the counting of 1 (data) holding memory cells over a search window while increasing the read level by a step width. FIG. 6 illustrates the thus obtained count of 1-holding memory cells for a particular read level on the vertical axis with the threshold voltage by corresponding DAC value on the horizontal axis. FIG. 6, however, includes the results for all read levels. After step S1, only the section for the current read level is obtained.

Figure 7:
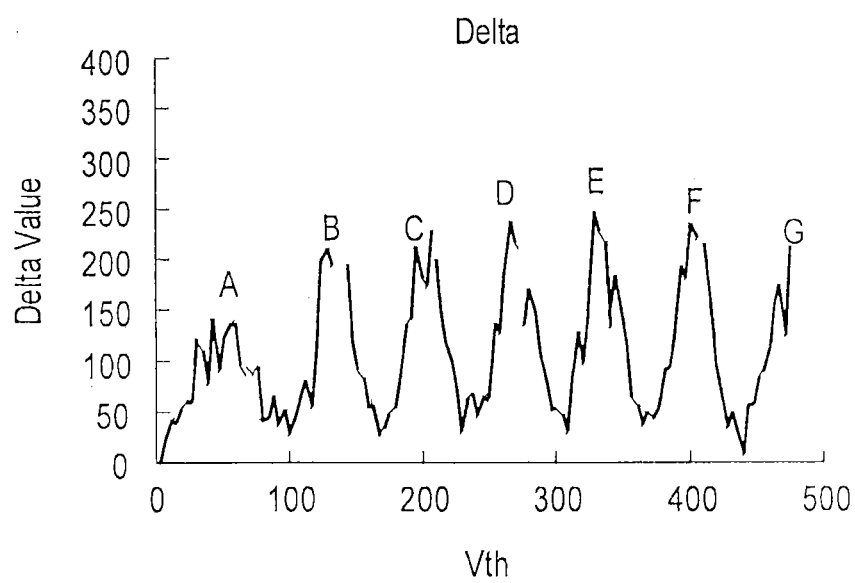
FIG. 7 illustrates an example of the differences between the numbers of 1-holding memory cells in the first embodiment.

In step S2, the memory controller 3 creates a histogram in accordance with the counts of 1-holding memory cells for respective voltages (level) of FIG. 6. Specifically, it calculates differences between the count for a particular voltage and that for an adjacent voltage, and executes this calculation for each voltage. Voltages are then plotted on the horizontal axis and differences in counts are plotted on the vertical axis to obtain a histogram as shown in FIG. 7. The histogram illustrates the count difference of 1-holding cells of FIG. 7 in units of 4 DAC on the horizontal axis. Moreover, it is created with an assumption that a voltage distribution for each data level is different and asymmetrical on its right-hand and left-hand sides from its center. The histogram also includes the results for all read levels. After step S2, only the section for the current read level is obtained.

In step S3, the memory controller 3 determines whether the threshold voltage with which the count of 1-holding cells exceeds an expected number of memory cells holding the data level one-level lower than the estimation target read level. This determination will be described in the following.

Figure 8:
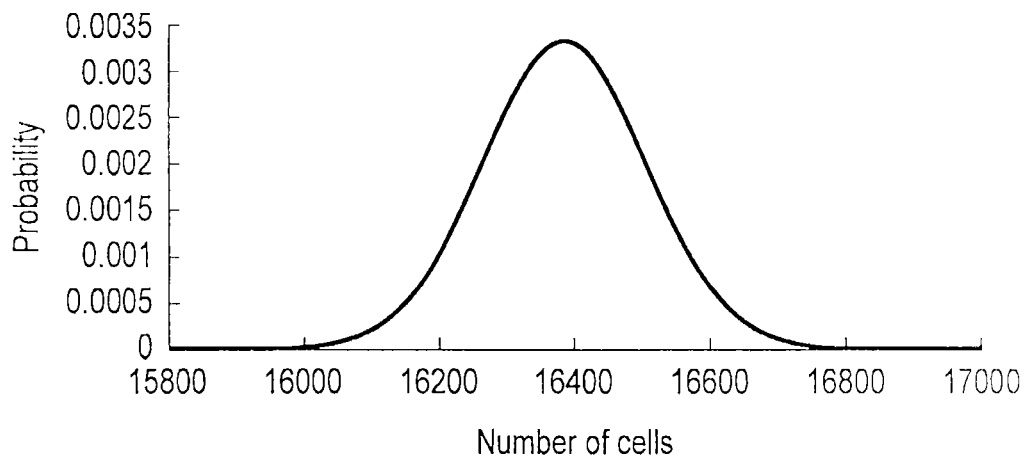
FIG. 8 illustrates a first example of the number of memory cells holding a particular data level and calculations of its probability.
Figure 9:
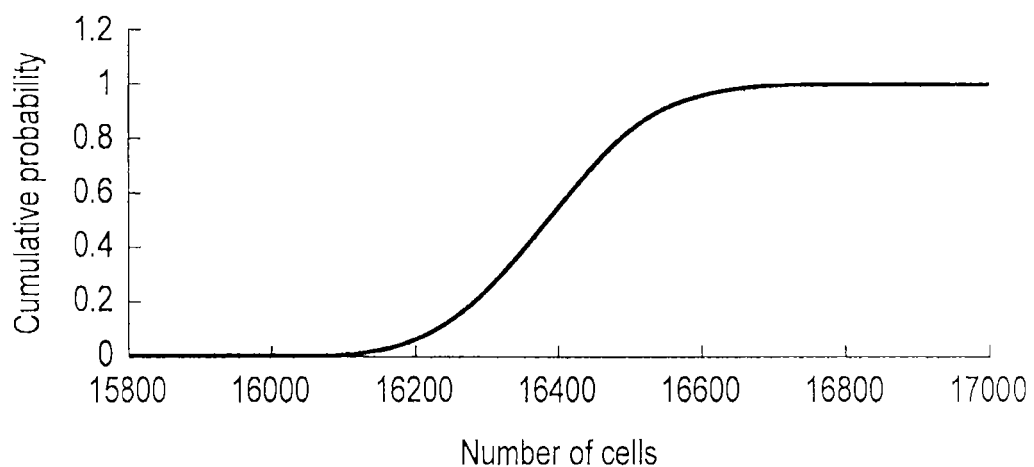
FIG. 9 illustrates the first example of the calculations in another form.

Randomization of write data is based on an algorithm designed to reduce the frequency for the sane logical bits (for example, 0) to appear in succession in the randomized data compared with the pre-randomized version. Based on mathematical character, with a sufficiently large data size, the counts of 0 and 1 in randomized data can be considered to be substantially the same, and the counts of memory cells set to have respective data-level-holding states with randomization can also be considered to be substantially the same. In other words, in accordance with this observation, the counts of memory cells of respective data-level-holding states are expected to be substantially the same, and each count is the quotient of the total number of data-holding memory cells divided by the number of data levels which each memory cell can take. Assume, for example, that an eight-level NAND flash memory stores 128 Kbit data in its particular area, and a linear feedback shift register (LFSR) is used as a typical example of randomization. Then, the number of memory cells for each data-level holding state in this area is expected to be 128K/8=16 Kbits (or, 16,384 bits). Further, the number of memory cells of a particular data-level holding state and its probability have a relation as illustrated in FIG. 8. FIG. 9 illustrates another version of FIG. 8 with its vertical axis replaced by a cumulative probability.

Figure 10:
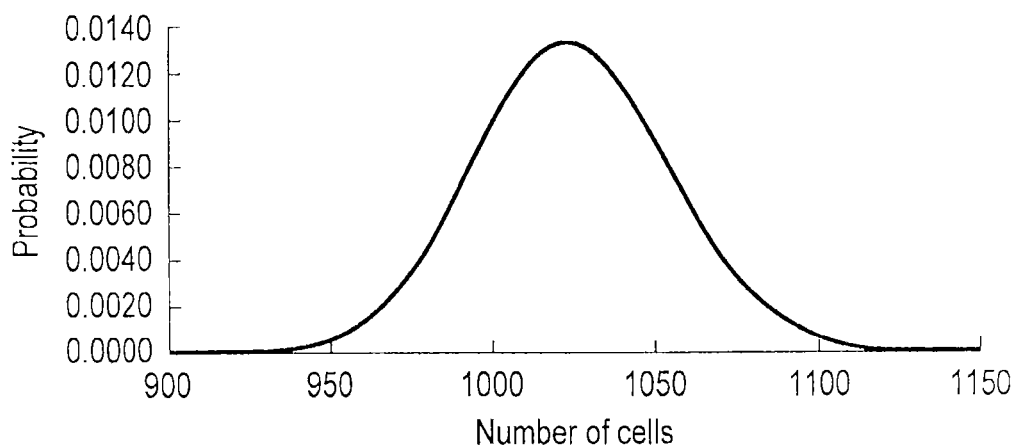
FIG. 10 illustrates a second example of the number of memory cells holding a particular data level and calculations of its probability.
Figure 11:
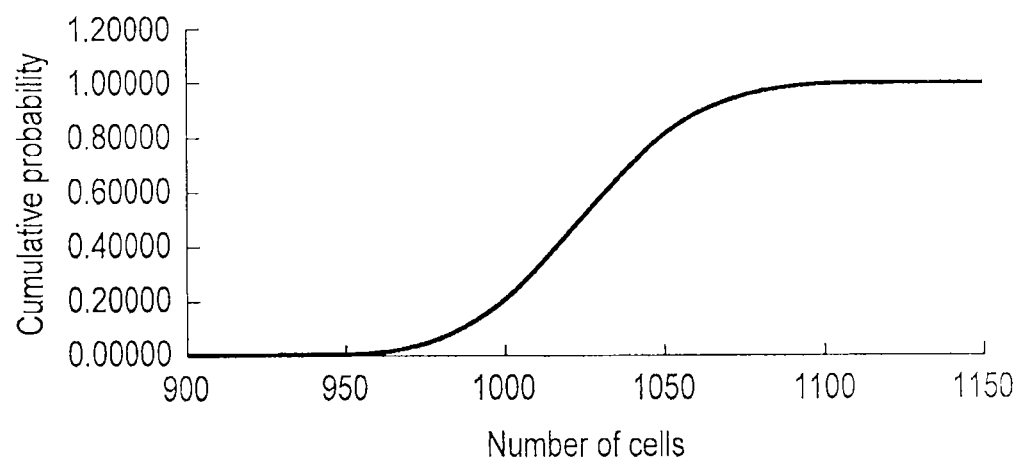
FIG. 11 illustrates the second example of the calculations in another form.

As can be seen from FIGS. 8 and 9, the number of memory cells of a state of holding a particular data level fall within a range of 16384, which is the expected value, ±500 bits. FIG. 10 illustrates an example of similar results with 8K memory cells, which are fewer than in FIG. 8. FIG. 11 illustrates another version of FIG. 10 with its vertical axis replaced by a cumulative probability. FIGS. 10 and 11 also illustrate that the number of the memory cells of a state of holding a particular data level substantially fall within a range of 1024, which is the expected value, ±100 bits. This observation on the distribution shows that, with data of the size of 1 Kbyte or more, among memory cells in a particular area with randomization, the number of memory cells of a state of holding each data level can be considered to concentrate within a range of ±10% of the expected value. Therefore, in accordance with an example of FIGS. 8 and 9, it is possible to execute a distribution read and consider that the read level which results in the 1-holding memory-cell count being an integral multiple of 16 Kbits as the read level to be estimated.

The specified value in step S3 was determined in accordance with the following examination. FIG. 12 illustrates the result of experiment for the read level for A level (or for distinguishing Er and A levels). Further, FIG. 12 uses a value to make the 1-holding-cell count equal to an eighth of the total number of memory cells in a particular area using FIG. 6 as the to-be-estimated read level on the vertical axis to illustrate a difference between that estimated read level and a default (i.e., a shift). FIG. 12 also illustrates a difference (or, a shift) between a read level which minimizes read errors and a default on its horizontal axis. Both axes use DAC as their units. If the actual shift (horizontal axis) and the shift based on the 1-holding-cell count (vertical axis) are completely correlated, the straight line y=x should be obtained. The plots greatly deviate from the line y=x in the range of the shift of 20 DAC or less, and actual shifts are correlated little with the 1-holding-cell-count based shifts. In contrast, in the range of the shift of over 20 DAC, the plots agree well with the line y=x, and the actual shifts are well correlated with the 1-holding-cell-count based shifts. Therefore, it can be seen that the shift estimation based on 1-holding-cell count is valid in the range of the shift of over 20 DAC. In addition, in this range, the estimation based on the local minimum does not often present a read level which minimizes read errors. This is because this range corresponds to a range of a skirt of a threshold-voltage-distribution curve for the data level below the read level in question as described above. Therefore, the first embodiment uses this estimation.

The memory controller 3 first determines whether the threshold voltage with which the count of 1-holding cell exceeds the expected number of memory cells holding the data level below the to-be-estimated read level exceeds the specified value in step S3 of FIG. 5 as described above. The expected number is an integral multiple of 16 Kbits in accordance with the above example. Specifically, it is 16K×n for the n$^{th}$ read level from the minimum data level (for example, Er) toward the maximum data level (for example, G level), where n is a natural number. More specifically, it is 16K×1 bits for A read level, and 16K×2 bits for B read level, and the same holds true for the remaining read levels. If this threshold voltage to result in memory-cell count exceeding the expected value exceeds the corresponding specified value, then this may mean that the threshold voltage of the memory cells in a state of holding at least one of data levels at the sides of the to-be-estimated read level has a long distribution as illustrated in FIG. 1. In such a distribution, the local minimum does not match the read level which minimizes read errors, and therefore is not the optimum read level. Then, the memory controller 3 determines whether the threshold voltage to result in the memory cells outnumbering the expectation exceeds the specified value in step S3. To this end, for example, the memory controller 3 determines whether the difference (or shift) between a candidate distribution-read read-voltage with which 1-holding cells outnumber the expectation and the corresponding default read level exceeds the specified value. The specified value can be a value beyond the shift of which the estimated read level based on the local minimum is highly likely to be erroneous, and can be determined with statistics and/or simulation. In one example, the specified value is 20 DAC in accordance with examination described with reference to FIG. 12. The value, however, is determined in accordance with the properties of the memory device 1, and 20 DAC is merely an example when the present application is filed. Alternatively, the memory controller 3 may determine whether the shift is larger than or equal to the specified value in step S3. The same holds true in the following description. Specifically, in a comparison of a value with a specified value (or threshold), the value being equal to the specified value may be determined as YES or NO herein.

When the determination in step S3 is No, this means that the shift of the candidate read voltage is in a region where its actual (or optimum) shift has a low correlation with a 1-holding-cell-count-based shift. Then, the memory controller 3 estimates the optimum read level in accordance with the local minimum of the obtained threshold voltage distribution (or histogram) in step S4. Any method for the estimation can be used as well as in any method described in the following embodiment. Specifically, the optimum read level can be estimated in accordance with the local minimum of threshold voltage distribution using methods described in the specifications of the U.S. patent application Ser. No. 13/544,147, the entire contents of which are incorporated herein by reference. Note that the "optimum" read level as used herein depends on the method of estimating a shifted read level. Therefore, the "optimum" read level does not mean the only optimum read level under all conditions. Rather, it refers to a read level determined to be optimum in the adopted method of estimation. The "optimum" read level, however, can be defined as minimizing errors of data which, using such read level, was read from memory cells for which the "optimum" read level is estimated.

In contrast, when the determination in step S3 is Yes, this means that the shift of the candidate read voltage is in a region where its actual (or optimum) shift has a high correlation with 1-holding-cell-count-based shift. In this region, the local-minimum-based estimation is likely to be erroneous. Then, the memory controller 3 estimates the read level in accordance with the 1-holding-cell count (step S5). Specifically, the memory controller 3 counts the memory cells with the threshold voltage over each different candidate voltage, and adopts, among the candidate voltages, a voltage which is exceeded by respective threshold voltages of memory cells of the number nearest to the predicted value (or, an integral multiple of one eighth of the total number of memory cells) as the read level to be estimated.

Any obtained shifts may be used in order to obtain a corresponding read level herein. Therefore, after a shift is obtained with any particular method of estimation and calculation, this shift may be added to the corresponding default read level. Obtaining the corresponding read level after obtaining a shift may not be described herein; however obtaining a shift may be accompanied by obtaining the corresponding read level, even if this is not stated in the description. Therefore, obtaining a shift and obtaining the corresponding read level may be interchangeably used herein. Similarly, various calculations, estimations and selections with shifts may be interchangeably used herein with calculations, estimations and selections with the read level corresponding to those shifts. The reason why a shift is associated with the corresponding read level is generally that the read level is managed as a shift from the default value, as described above.

As described above, according to the first embodiment, when the read level shift can be suitably estimated in accordance with the 1-holding-cell count through the distribution read, such estimation is executed. When the estimation based on 1-holding-cell count is suitable, the read level shift estimation based on the local minimum may be unreliable. Such a case is first specified, and when suitable, a shift is estimated based on the 1-holding-cell count. Estimation based on the 1-holding-cell count produces more accurate results even when the estimation based on the local minimum presents less accurate results. This results in improvement in accuracy of the estimation of the read level.

Second Embodiment

In the second embodiment, a read level is calculated from other read levels.

The semiconductor memory device of the second embodiment has the same configuration as that of the first embodiment though the memory controller 3 is configured to execute the following processes.

In a NAND flash memory such as the memory 2, it is difficult to estimate the A read level through the distribution read for the following reasons. The NAND flash memory cannot set negative read levels (including those for distribution reads) unless a special measure is taken. However, Er level is generally negative, and therefore A read level is often near zero. For this reason, a negative optimum A read level may result in the local minimum of threshold voltage distribution to exist outside a region where the distribution read is executable. The local minimum outside the executable area may result in a large number of memory cells with near-zero threshold voltages. Therefore, the read level estimation based on the local minimum is likely to be erroneous.

Moreover, as illustrated in FIG. 1, the distribution for Er level may spread with use, and the number of memory cells with a near-zero threshold voltage may increase. In contrast, the distribution for Er level is widely flat, and therefore the optimum A read level is shifted from the default in the positive direction to be absorbed in the mountain of the distribution for the A level. Then, the local-minimum-based estimation may estimate any value between zero and the actual optimum read level as the optimum because of influences from variation in read data during a distribution read (or noise). When not only the A read level but other read levels become to have a wide or highly asymmetrical distribution, they may suffer from the same phenomenon.

In a multi-level NAND flash memory, the distributions of some read levels are likely to become spread, and others might not be. Thus, there is a method to estimate a read level associated with a data level less likely to have its distribution spread, which is used to estimate another read level. However, different types of stress such as disturb and data retention deterioration generally result in different shifts of threshold voltages, whereas it is difficult to estimate the type of stress with this method based on one estimated read level. In contrast, read levels close to each other exhibit highly-correlated shifts. In the second embodiment, these two features are used to estimate a shift of a read level.

Figure 13:
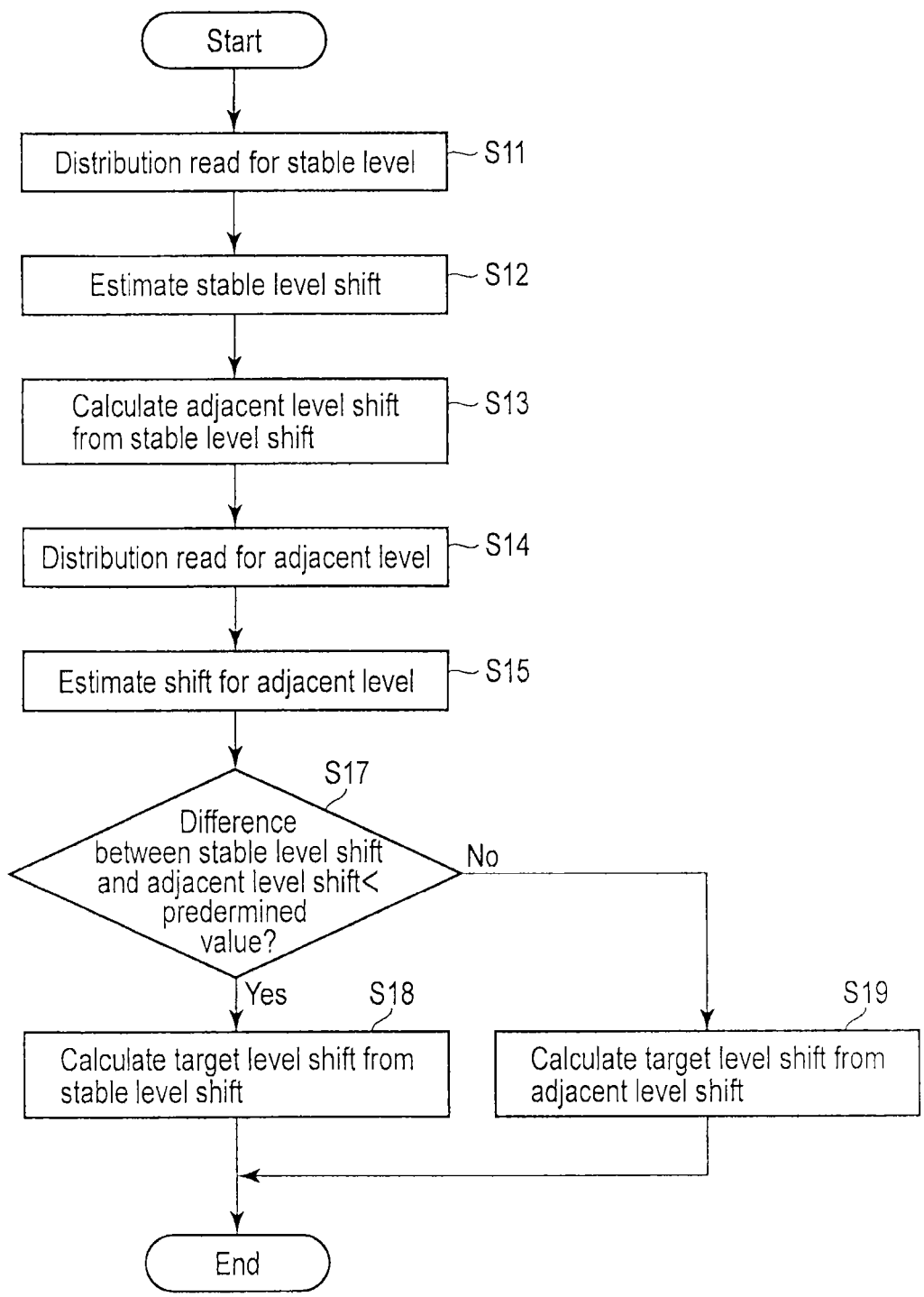
FIG. 13 is a flowchart of read level shift estimation according to a second embodiment.

Estimation of the shift of the read level according to the second embodiment will now be described with reference to FIG. 13. FIG. 13 illustrates the flow of read level shift estimation according to the second embodiment. The following description is associated with an example to estimate A read level; however it is also applicable to other read levels.

In step S11, the memory controller 3 executes a distribution read to estimate a read level whose threshold voltage distribution does not spread much and which can be relatively stably estimated. Such a read level is referred to as a stable read level. The stable read level is, for example, a read level one-level smaller than the maximum read level, and is specifically F level in this context. The maximum read level experiences the least shift; however it is not used as the stable read level because the requirements for the threshold voltage control of the maximum read level are generally looser than those for other read levels, which therefore makes it inconvenient to be used.

In step S12, the memory controller 3, for the stable read level, generates a histogram, estimates the optimum value, and calculates a shift Shift_STA(STA) of the optimum value from the default. The estimation of shift in the embodiment and any following embodiment can be implemented with the first embodiment. The steps for the distribution read and read level shift estimation are the same as steps S1 and S2.

In step S13, the memory controller 3 uses the stable read level shift Shift_STA(STA) to calculate a shift Shift_STA(ADJ) for a read level adjacent the to-be-estimated read level, which is referred to as an adjacent read level. For example, the adjacent read level is the read level adjacent, in particular one-level higher than the to-be-estimated read level, which is B level in this context. The formula for the calculation can be predetermined in accordance with the relationship between the default stable read level and the default to-be-estimated read level. Moreover, the formula can be a linear expression in order to be easily executed by the CPU 13, and can be as follows, for example:

$$\text{Shift\_STA(ADJ)} = \alpha_{STA\_ADJ} \times \text{Shift\_STA(STA)} + \beta_{STA\_ADJ},$$

where $\alpha_{STA\_ADJ}$ and $\beta_{STA\_ADJ}$ are constants to estimate the adjacent read level shift from the stable read level shift.

In steps S14 and S15, the memory controller 3 actually estimates the adjacent read level shift. Specifically, for the adjacent read level, the memory controller 3 executes the distribution read, generates a histogram, estimates the optimum value, and estimates shift Shift_ADJ(ADJ) from the default optimum value.

In step S17, the memory controller 3 determines whether the absolute difference between the calculated adjacent read level shift Shift_STA (ADJ) and estimated adjacent read level shift Shift_ADJ (ADJ) is below a specified value. The specified value is 9 DAC, for example. When the determination in step S17 is Yes, this means that the stable read level shift is highly correlated with the adjacent read level shift. It is also expected that the stable read level shift is highly correlated with the to-be-estimated read level shift. Then, the memory controller 3 uses the stable read level shift Shift_STA(STA) to calculate the to-be-estimated read level shift Shift_STA (TRG) (step S18). The formula for calculation can be predetermined in accordance with the relationship between the default stable read level and the default to-be-estimated read level, and in particular as follows:

$$\text{Shift\_STA(TRG)} = \alpha_{STA\_TRG} \times \text{Shift\_STA(STA)} + \beta_{STA\_TRG},$$

where $\alpha_{STA\_TRG}$ and $\beta_{STA\_TRG}$ are constants to estimate the to-be-estimated read level shift from the stable read level shift. This calculation is illustrated in FIG. 14.

In contrast, when the determination in step S17 is No, this means that the stable read level shift is not well correlated with the adjacent read level shift. It is also expected that the stable read level shift is not well correlated with the to-be-estimated read level shift. Then, the memory controller 3 uses the adjacent read level shift Shift_ADJ(ADJ) to calculate the to-be-estimated read level shift Shift_ADJ(TRG) (step S19). This is because the to-be-estimated read level shift is generally correlated with the adjacent read level shift more highly. The formula for calculation can be predetermined in accordance with the relationship between the default adjacent read level and the default the to-be-estimated read level, and in particular as follows:

$$\text{Shift\_ADJ(TRG)} = \alpha_{ADJ\_TRG} \times \text{Shift\_ADJ(ADJ)} + \beta_{ADJ\_TRG},$$

where $\alpha_{ADJ\_TRG}$ and $\beta_{ADJ\_TRG}$ are constants to estimate the to-be-estimated read level shift from the adjacent read level shift. This calculation is illustrated by FIG. 14.

The description so far has covered use of either the F or B read level shift to calculate the A read level shift. This is based on the high correlation between the A read level shift and adjacent B read level shift. It is not, however, essential to use an adjacent read level. Any read level shift generally highly correlated with the to-be-estimated read level shift can be used as the adjacent read level shift. For example, in order to calculate the D read level, the adjacent read level may be the B read level instead of the C read level. This is because the C and D read level shifts have a similar correlation with the B read level shift.

As described above, according to the second embodiment, a to-be-estimated read level shift is calculated in accordance with estimation with a higher correlation of estimation based on the stable read level shift and estimation based on the adjacent read level shift. This allows the to-be-estimated read level shift to be estimated more precisely than the estimation based on a particular read level shift. Such a precisely-estimated value reflects the state of the shift by associated stress better.

Third Embodiment

The third embodiment is directed to problems described in relation with the second embodiment, and is related to an approach different from that of the second embodiment.

Figure 15:
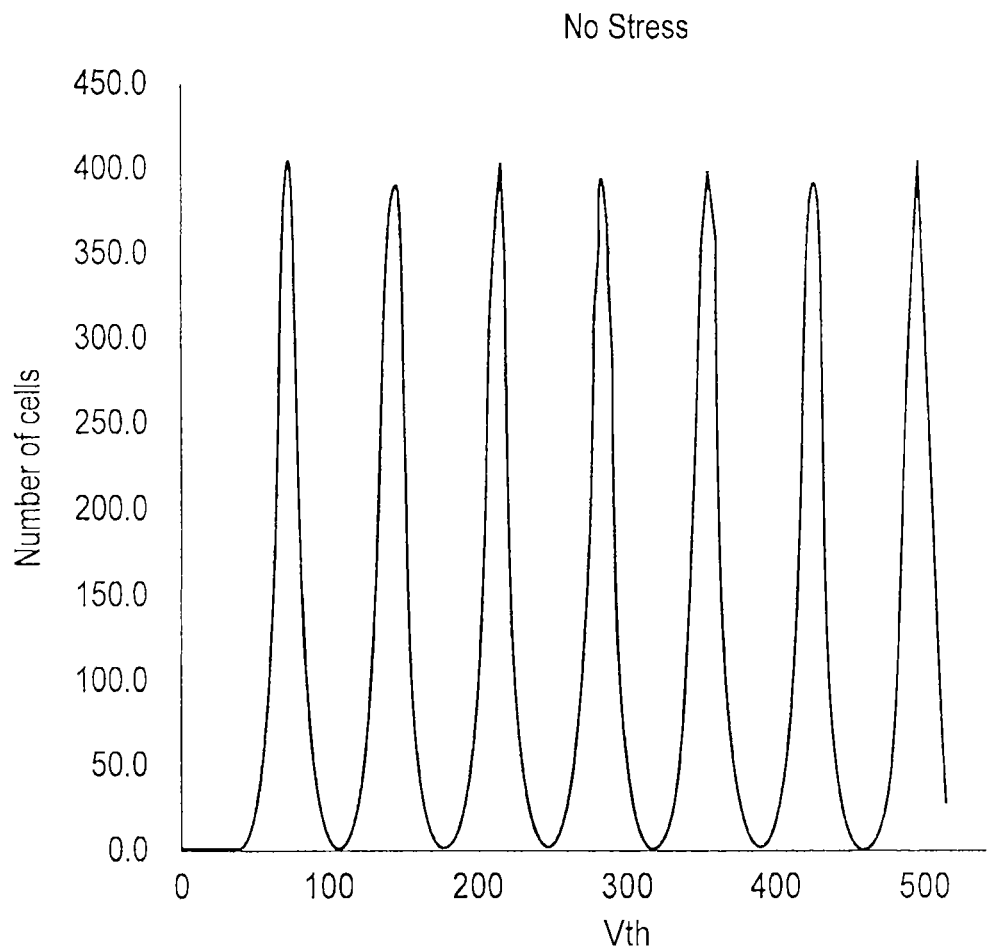
FIG. 15 illustrates a threshold voltage distribution of cell transistors before receiving stress.

Generally, stress patterns of a NAND flash memory including the memory 2 are roughly classified into the following three types: read disturb (RD stress), program (write) disturb (PD stress), and data retention deterioration (DR stress). A threshold voltage distribution of cell transistors before receiving stress is as shown in FIG. 15, for example. The threshold voltage distribution changes with stress.

Figure 16:
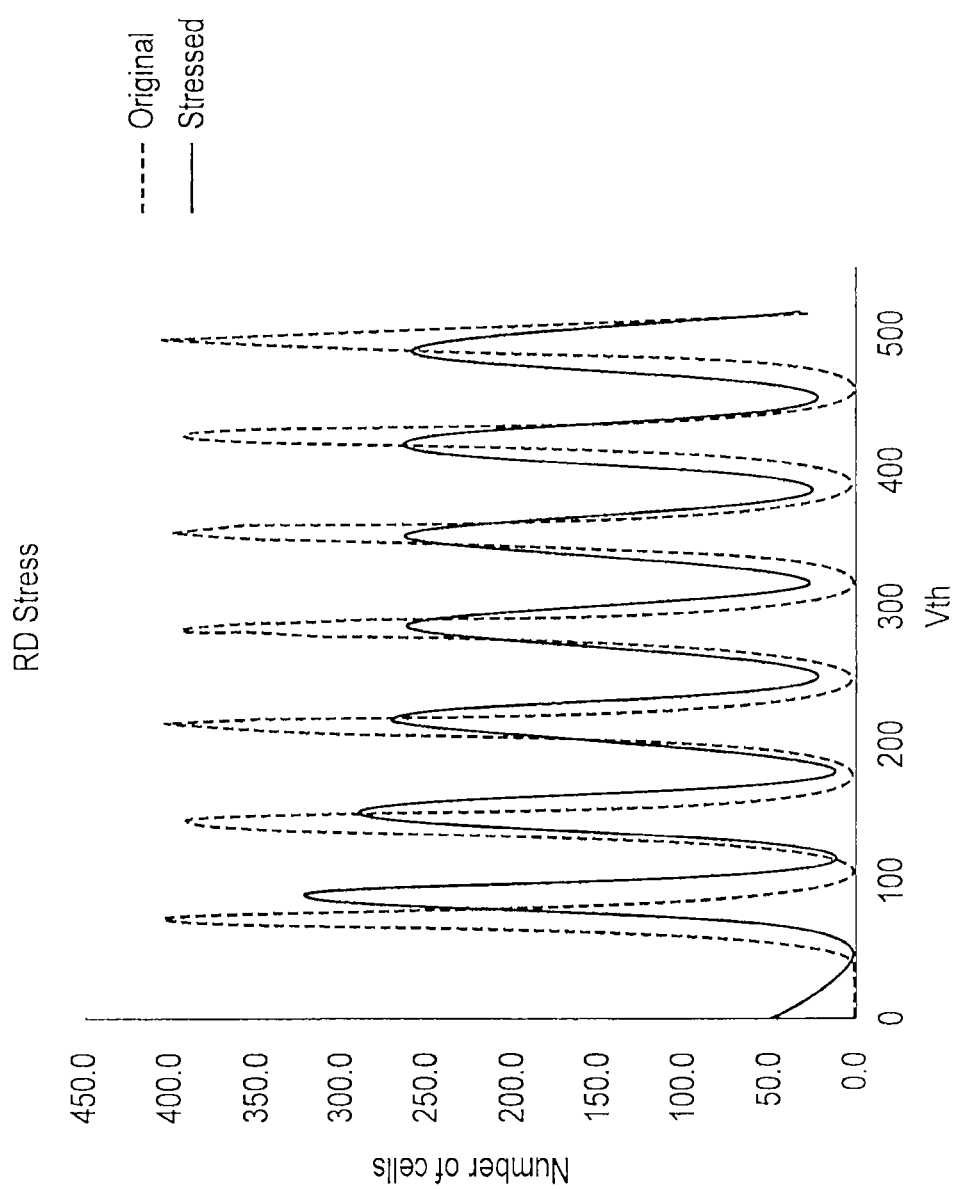
FIG. 16 illustrates an example of a threshold voltage distribution of cell transistors which received RD stress.

FIG. 16 illustrates an example threshold voltage distribution of cell transistors which received the RD stress. The RD stress is experienced by memory cells from which data was repeatedly read. The RD stress extends the distribution for the Er level, and also extends the distributions of the A and B levels slightly, and hardly affects the distributions of C to G levels. In other words, the RD stress greatly shifts the threshold voltages for A and B levels in the positive direction, but hardly shifts those for F level because a large voltage VREAD over the maximum read level is applied to unselected memory cells in a page to be read. For this reason, memory cells with a threshold voltage positioned further from the voltage VREAD receive a larger stress due to the voltage VREAD. Examples of eight data levels greatly shifted in the positive direction by the RD stress are A and B read levels. In accordance with this phenomenon, the B read level is observed for the RD stress determination, for example.

Figure 17:
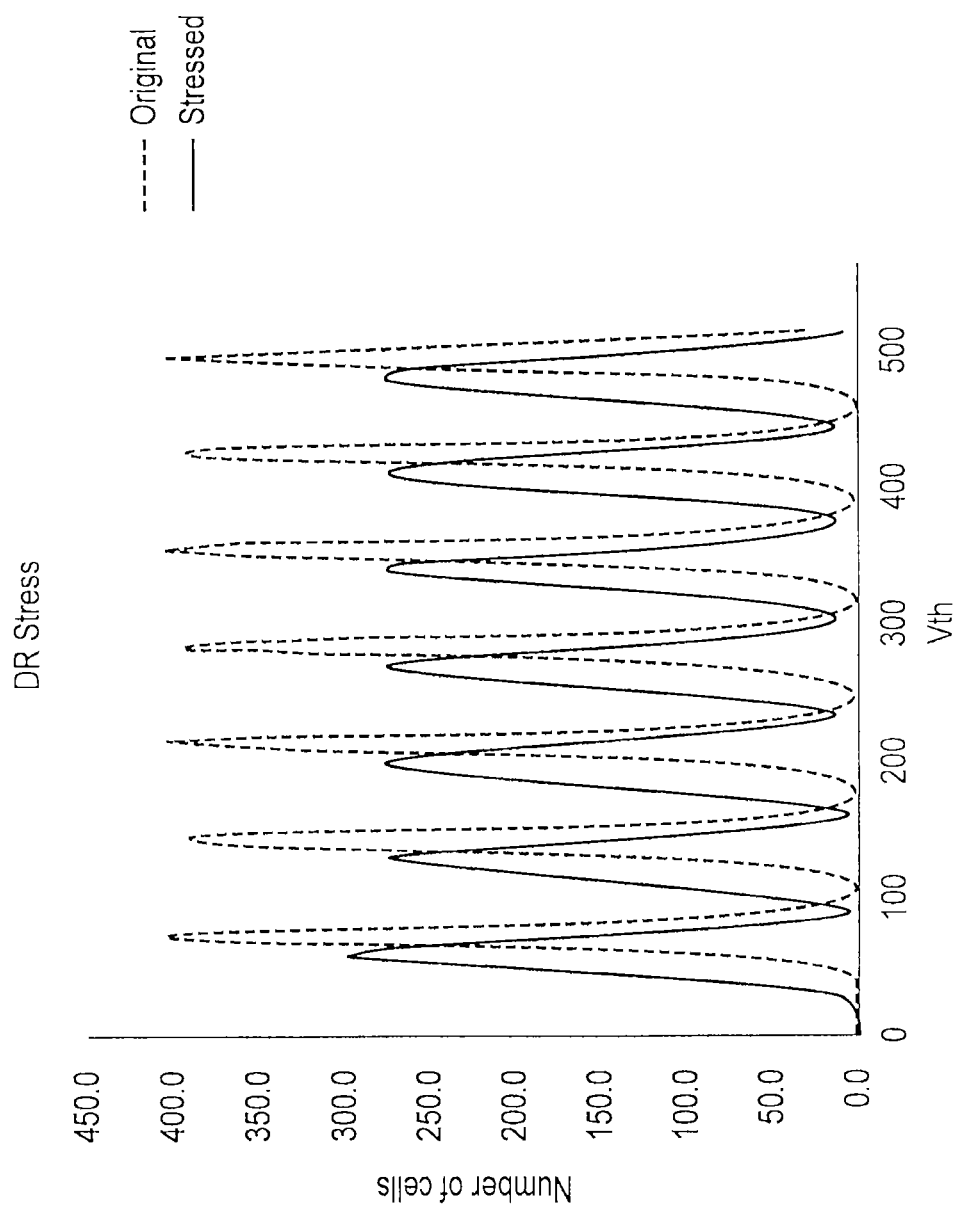
FIG. 17 illustrates an example of a threshold voltage distribution of cell transistors which received DR stress.

FIG. 17 illustrates an example threshold voltage distribution of cell transistors which received the DR stress. The DR stress is experienced by memory cells after much time has elapsed after data is written. The DR stress shifts all data levels in the negative direction. Therefore, the DR stress shifts both B and F read levels in the negative direction.

Figure 18:
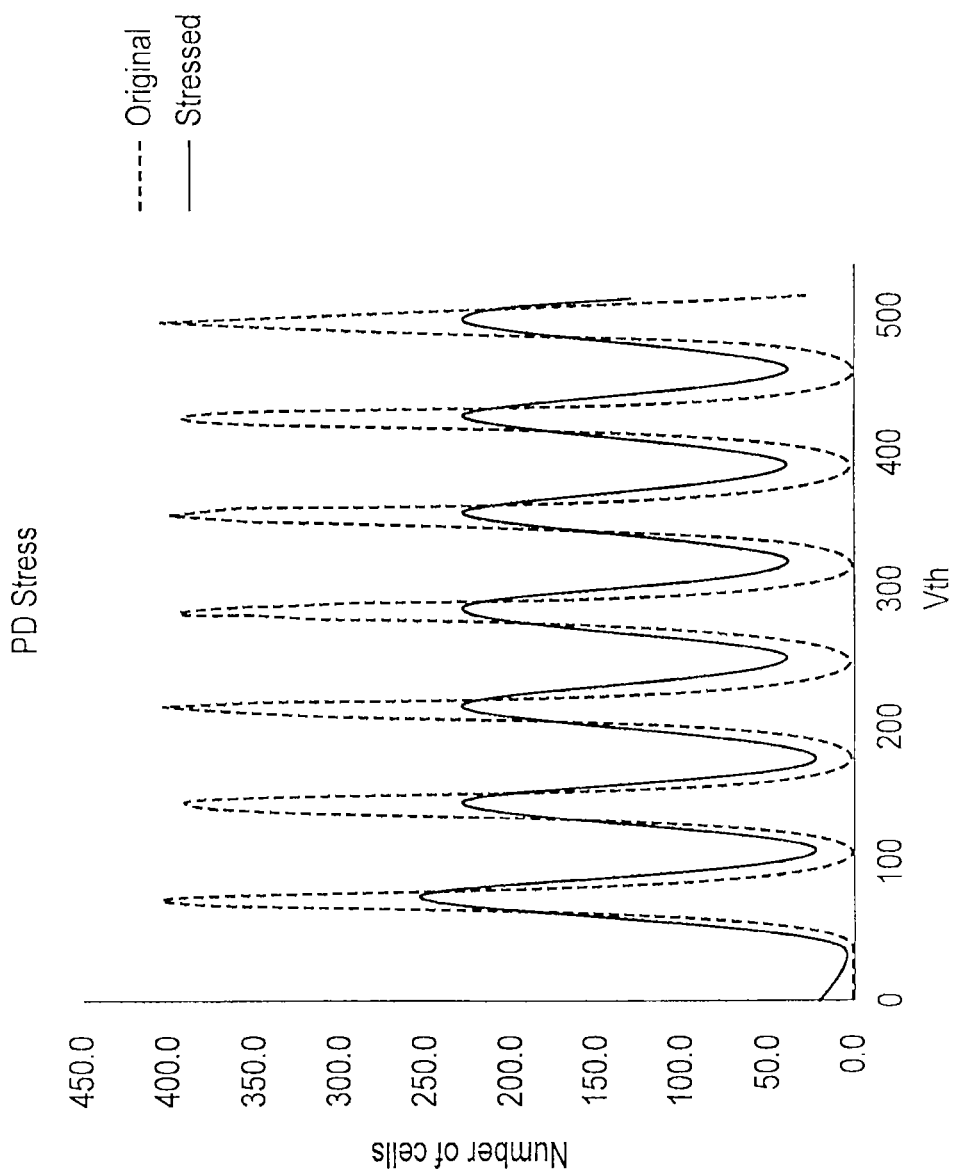
FIG. 18 illustrates an example of a threshold voltage distribution of cell transistors which received PD stress.

FIG. 18 illustrates an example threshold voltage distribution of cell transistors which received the PD stress. The PD stress is experienced by memory cells which have been repeatedly data written, and extends asymmetrically the threshold voltage distribution for all data levels. Therefore, it shifts both B and F read levels in the positive direction.

From above, the combination of the directions of the shifts of B read level and F read level can determine which stress is dominant. The third embodiment uses this determination.

FIG. 19 illustrates the flow of read level shift estimation according to the third embodiment. The semiconductor memory device of the third embodiment has the same configuration as that of the first embodiment though the memory controller 3 of the third embodiment is configured to execute the following processes.

In step S21, the memory controller 3 estimates a stable read level through the distribution read, and calculates a value Shift_STA(STA) of the shift of estimated read level from its default. The stable read level may be, for example, an F or E read level.

In step S22, the memory controller 3 estimates a reference read level through the distribution read, and calculates a value Shift_REF(REF) of the shift of the estimated read level from its default. The reference read level is the maximum one of the read levels which are greatly shifted in the positive direction by the RD stress as described above. The reference read level may be, for example, the B or C read level. Step S22 may precede step S21.

After step S23, the stable and reference read level shifts are used to determine how the threshold voltages of read target memory cells are shifted. First, the memory controller 3 determines whether the reference read level shift exceeds a first specified value (step S23). The first specified value depends on the properties of the memory 2, and on a reference read level shift sufficient to determine that the memory cells experienced the RD stress based on statistics of actual reference read level shifts by the RD stress and/or simulation, for example. More specifically, the first specified value is positive, and is 8 DAC, for example.

When the determination in step S23 is Yes, it is expected that the memory cells of the shift estimation target received the RD stress, and the flow proceeds to step S31. In step S31, the memory controller 3 uses the stable read level shift Shift_STA(STA), reference read level shift Shift_REF(REF), and a formula for RD to calculate remaining read level shifts. A formula for RD for each read level shift depends on the properties of the memory 2, and can be predetermined in accordance with statistics of each optimum read level actually estimated through the distribution read for RD-stressed memory cells and/or simulation, for example. For example, the A to G read level shifts Shift(A) to Shift(G) can be calculated by the following formulas:

$$Shift(A)=1.1 \times Shift\_REF(REF)+6$$

$$Shift(B)=Shift\_REF(REF)$$

$$Shift(C)=0.9 \times Shift\_REF(REF)-6$$

$$Shift(D)=0.9 \times Shift\_STA(STA)+2$$

$$Shift(E)=0.95 \times Shift\_STA(STA)+1$$

$$Shift(F)=Shift\_STA(STA)$$

$$Shift(G)=1.1 \times Shift\_STA(STA)-1.$$

In this example, the stable and reference read level shifts are used as they are as the F and B read level shifts, respectively; however they may also be adjusted with formulas.

When the determination in step S23 is No, the flow proceeds to step S24. The DR stress shifts all data levels in the negative direction as described above, and therefore it shifts both the reference and stable read levels in the negative direction. Then, in order to distinguish the DR stress from the PD stress, the memory controller 3 determines whether the reference read level shift is below a second specified value in step S24. The second specified value depends on the properties of the memory 2, and on a reference read level shift sufficient to determine that the memory cells experienced the DR stress based on statistics of actual reference read level shifts by the DR stress and/or simulation, for example. More specifically, the second specified value is negative, and is −4 DAC, for example.

When the determination in step S24 is Yes, the memory controller 3 further determines whether the stable read level shift is below a third specified value in order to determine whether the DR stress (step S25). The third specified value depends on the properties of the memory 2, and on a stable read level shift sufficient to determine that the memory cells experienced the DR stress based on statistics of actual stable read level shifts by the DR stress and/or simulation, for example. More specifically, the third specified value is negative, and is −2 DAC, for example. Step S25 may precede step S24.

When the determination in step S25 is Yes, it is expected that the memory cells of the shift estimation target received the DR stress, and the flow proceeds to step S32. In step S32, the memory controller 3 uses the stable read level shift Shift_STA(STA) to calculate remaining read level shifts. A formula for DR for each read level shift depends on the properties of the memory 2, and can be predetermined in accordance with statistics of each optimum read level actually estimated through the distribution read for DR-stressed memory cells and/or the simulation, for example. For example, the A to G read level shifts Shift(A) to Shift(G) can be calculated by the following formulas:

$$Shift(A)=0.5 \times Shift\_STA(STA)-8$$

$$Shift(B)=0.7 \times Shift\_STA(STA)-2$$

$$Shift(C)=0.8 \times Shift\_STA(STA)-4$$

$$Shift(D)=0.9 \times Shift\_STA(STA)-2$$

$\text{Shift}(E) = 0.95 \times \text{Shift\_STA(STA)} - 1$ $\text{Shift}(F) = \text{Shift\_STA(STA)}$ $\text{Shift}(G) = 1.2 \times \text{Shift\_STA(STA)} + 1.$ In this example, the estimated stable read level shift is used as it is as the F read level shift; however it may also be adjusted with a formula.

Figure 20:
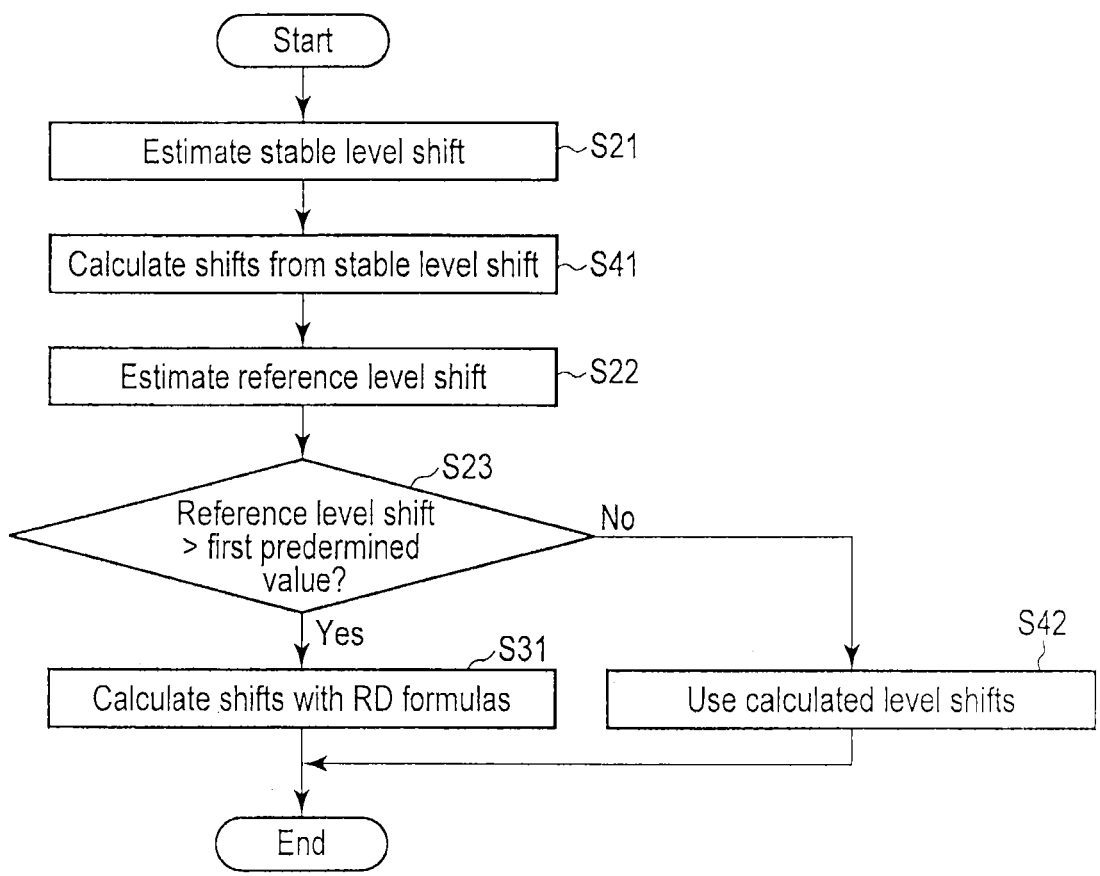
FIG. 20 is a flowchart of a second example of read level shift estimation according to the third embodiment.

In contrast, when the determination in step S24 or 25 is No, it is expected that the memory cells of shift estimation target received the PD stress, and the flow proceeds to step S33. In step S33, the memory controller 3 uses the stable read level shift Shift_STA(STA) to calculate remaining read level shifts. A formula for PD for each read level shift depends on the properties of the memory 2, and can be predetermined in accordance with statistics of each optimum read level actually estimated through the distribution read for PD-stressed memory cells and/or the simulation, for example. For example, the A to C read level shifts Shift(A) to Shift(G) can be calculated by the following formulas:

$\text{Shift}(A) = 0.8 \times \text{Shift\_STA(STA)} - 6$ $\text{Shift}(B) = 0.85 \times \text{Shift\_STA(STA)} - 4$ $\text{Shift}(C) = 0.9 \times \text{Shift\_STA(STA)} - 3$ $\text{Shift}(D) = 0.95 \times \text{Shift\_STA(STA)} - 2$ $\text{Shift}(E) = 0.98 \times \text{Shift\_STA(STA)} - 1$ $\text{Shift}(F) = 0.95 \times \text{Shift\_STA(STA)} + 1$ $\text{Shift}(G) = 1.1 \times \text{Shift\_STA(STA)} + 1.$ The flow of the third embodiment may be simplified as shown in FIG. 20, which illustrates the flow of a second example of read level shift estimation according to the third embodiment. As described above, the DR stress shifts read levels substantially uniformly and the PD stress also shifts them substantially uniformly, whereas the RD stress does not shift them uniformly. Then, the stable read level shift is used to calculate remaining read level shifts for the DR and PD stress, and the stable and reference read level shifts are used to calculate remaining read level shifts for the RD stress.

As illustrated in FIG. 20, the memory controller 3 uses the stable read level shift to calculate remaining read level shifts after step S21 (step S41). The formulas for calculation depend on the properties of the memory 2, and can be predetermined in accordance with statistics of each optimum default read level shift and/or simulation. The calculated read level shifts will be used when it is later determined that it is not RD stress. For example, the A to G read level shifts Shift(A) to Shift(G) can be calculated by the following formulas:

$\text{Shift}(A) = 0.55 \times \text{Shift\_STA(STA)} - 7$ $\text{Shift}(B) = 0.75 \times \text{Shift\_STA(STA)} - 3$ $\text{Shift}(C) = 0.85 \times \text{Shift\_STA(STA)} - 3$ $\text{Shift}(D) = 0.92 \times \text{Shift\_STA(STA)} - 1$ $\text{Shift}(E) = 0.96 \times \text{Shift\_STA(STA)} - 2$ $\text{Shift}(F) = \text{Shift\_STA(STA)} + 2$ $\text{Shift}(G) = 1.15 \times \text{Shift\_STA(STA)} + 2.$ Step S41 continues to step S22.

When the determination in step S23 is No, it is expected that the memory cells of the shift estimation target did not receive the RD stress. The memory controller 3 then adopts the read level shifts calculated in step S41 (step S42).

In contrast, when the determination in step S23 is Yes, it is expected that the memory cells of shift estimation target received the RD stress. The memory controller 3 then uses the formulas for RD to calculate read level shifts in step S31, which has been described above.

As described above, according to the third embodiment, for a particular read level shift estimation, another typical read level shift is used to determine the type of stress, and a to-be-estimated read level shift is calculated in accordance with the determined stress. Shifts of threshold voltages of memory cells differ in accordance with the stress experienced by the memory cells. To address this, according to the third embodiment, the type of stress is taken into consideration and therefore more accurate read level shifts can be obtained. Particularly, a shift of a low read level (for example, A and/or B read levels) can be estimated more accurately than a case where a to-be-estimated read level shift is calculated equally without taking a shift or the to-be-estimated read level shift into account.

Fourth Embodiment

The memory 2 erases data per block, and can only write data in erased blocks and cannot perform overwrites. Therefore, memory cells in the same block generally experience the same number of sets of erase and write, and have data written at substantially the same time instance. Moreover, in the NAND flash memory such as the memory 2, memory cells in a block including to-be-read cells also receive the RD stress. Therefore, the memory cells in the same block receive substantially the same PD stress and RD stress, and also elapsed time after write. For this reason, the memory cells in the same block should receive substantially the same total amount of stress.

It is also known that characteristics of memory cells in the same block, such as threshold voltage shift by the same stress, depend on word lines. Specifically, a memory cell coupled to, for example, a particular word line 10 has a threshold voltage shift more similar to that of a memory cell coupled to a near word line such as word line 11 or 12 than a further word line such as word line 50.

For this reason, when a shift estimated for a memory cell coupled to a particular word line differs from that for a near word line greatly, the estimated shift is likely to be erroneous because of noise in distribution read, etc. The fourth embodiment uses this property.

The semiconductor memory device of the fourth embodiment has the same configuration as that of the first embodiment though the memory controller 3 of the fourth embodiment and is configured to execute the following processes.

When a read with a read level shift estimated for memory cells coupled to a particular word line WLA is beyond the correcting capability of the ECC circuit 18, the memory controller 3 uses other word lines WLB and WLC in the block including the word line WLA. Specifically, the memory controller 3 uses shifts (Shift(B), Shift(C)) of memory cells coupled to the respective word lines WLB and WLC for the same read level as the read level for which the shift is estimated. These read level shifts for other word lines are shifts which enabled successful correction of errors in data read using them.

As an example, the word lines WLB and WLC are adjacent the word line WLA at respective sides. Alternatively, the word lines WLB and WLC are assigned a number smaller than the word line WLA, and in particular they are in line in the order of the word lines WLB, WLC and WLA. Alternatively, the word lines WLB and WLC are assigned a number larger than the word line WLA, and in particular they are in line in the order of the word lines WLA, WLB and WLC.

As the simplest example, the memory controller 3 uses the average of the shifts for the word lines WLB and WLC as the shift for the word line WLA. FIGS. 21 to 25 illustrate such examples, and illustrate first to fifth examples of read level shift estimation according to the fourth embodiment, respectively.

In the FIG. 21 example, the word lines WLB, WLA and WLC adjoin in this order, and are, for example, word lines WL10, WL11 and WL12. Assume that estimated read level shifts for a page associated with the word line WLA are as illustrated in the upper part of FIG. 21. Further assume that a shift of the B read level is 5 DAC as indicated by the enclosure. Still further, assume that an actual shift of the read level is, however, about −4 DAC, for example. Such incorrect estimation results in failed correction of errors in data read from the page of the word line WLA. Then, if the shift of the read level for the page of an adjacent word line is already estimated, the memory controller 3 uses it. Specifically, it readopts the average of the shifts of the B read level for the word lines WLB and WLC as the shift of the B read level for the word line WLA. The fraction of the average is omitted in the FIG. 21 example. The result of correction is illustrated in the lower part of FIG. 21.

When a data read with a read level shift estimated for a particular word line has its errors successfully corrected, the memory controller 3 stores the shift for that word line. Then, it stores values in the RAM 19 in the form of a table as illustrated in FIG. 21 and following FIGS. 22 to 25.

In the example of FIG. 21 and following FIGS. 22 to 25, a shift of a particular read level is known to have many errors, and based on this only the shift of that read level with many errors is estimated from other corresponding shifts for the purpose of description. When errors of read data cannot be, however, corrected, which read level shift has many errors is generally unknown. Then, when the memory controller 3 fails in error correction, it estimates shifts of all read levels associated with the target word line from the corresponding shifts for other word lines.

In the FIG. 22 example, the word lines WLB, WLC and WLA adjoin in this order, and are, for example, WL10, WL11 and WL12. Assume that estimated read level shifts for a page associated with the word line WLA are as illustrated in the upper part of FIG. 21. Further assume that a shift of the A read level is −5 DAC as indicated by the enclosure. Still further, assume that an actual shift of the read level is, however, about −4 DAC, for example. Then, the memory controller 3 readopts the average of the shifts of the A read level for the word lines WLB and WLC as the shift of the A read level of the word line WLA. The result of correction is illustrated in the lower part of FIG. 22.

In the FIG. 23 example, the word lines WLA, WLB and WLC adjoin in this order, and are, for example, WL10, WL11 and WL12. Assume that estimated read level shifts for a page associated with the word line WLA are as illustrated in the upper part of FIG. 23. Further assume that a shift of the G read level is −10 DAC as indicated by the enclosure. Still further, assume that an actual read level shift is, however, about 3 DAC, for example. Then, the memory controller 3 readopts the average of the shifts of the G read level for the word lines WLB and WLC as the shift of the G read level of the word line WLA. The result of correction is illustrated in the lower part of FIG. 23.

A read level shift of a target word line may be estimated with a value of a non-adjacent word line. FIG. 24 illustrates such an example. The FIG. 24 example can be used when a value of an adjacent word line cannot be used, for example. In this example, the word lines WLB, WLA and WLC are WL6, WL11 and WL21, for example. Assume that estimated read level shifts for a page associated with the word line WLA are as illustrated in the upper part of FIG. 24. In this example, only the shift of the C read level (illustrated with the enclosure) is positive, which is erroneous. The memory controller 3 then weight-averages the reciprocal of the distance between the word lines WLA and WLB (WL(A)−WL(B)) and that of the distance between the word lines WLA and WLC (WL(C)−WL(A)) with the shifts for the word lines WLB and WLC to estimate the shift for the word line WLA (Shift(A)). Specifically, the shift is calculated, for example, from the following formula:

$$\text{Shift}(A) = \{(WL(C) - WL(A)) \times \text{Shift}(B) + (WL(A) - WL(B)) \times \text{Shift}(C)\} / \{(WL(C) - WL(A)) + (WL(A) - WL(B))\}.$$

This formula is designed to allow a nearer word line to have a larger influence. Another formula or a simple average as in the FIG. 21 example may be used.

The result of correction is illustrated in the lower part of FIG. 24.

A shift for a target word line may be estimated with a value for another word line. FIG. 25 illustrates such an example. The FIG. 25 example can be used when shifts for two other word lines cannot be used, for example. In this example, the word lines WLB and WLA are WL3 and WL11, for example. Assume that estimated read level shifts to a page associated with the word line WLA are as illustrated in the upper part of FIG. 25. In this example, only the shift of the B read level (indicated by the enclosure) is positive, which is erroneous. Then, the memory controller 3 uses the shift for the only estimated word line WLB in the same block as the word line WLA as it is for the shift for the word line WLA, for example. The result of correction is illustrated in the lower part of FIG. 25.

As described above, according to the fourth embodiment, a read level shift for a page associated with a particular word line is calculated with the corresponding read level shift for a page associated with another word line in the same block as that particular word line. In particular, when errors of data from a page of a particular word line cannot be corrected, a shift for an unsuccessfully-error-corrected word line is calculated with a shift for another successfully-error-corrected word line. As a result, the shift for the unsuccessfully-error-corrected word line is adjusted to allow for successful error correction. The calculation from the shift for another word line is a simple operation, which enables correct data reads with a simple process.

Fifth Embodiment

The fifth embodiment is also based on correlation of word lines as in the fourth embodiment.

The semiconductor memory device of the fifth embodiment has the same configuration as that of the first embodiment though the memory controller 3 of the fifth embodiment is configured to execute the following processes.

A word line at one end of a particular block (for example, the word line of with the minimum number) and that at the other end of a particular block (for example, the word line with the maximum number) have different properties from those of other word lines. The reason for this is physical asymmetry of a memory cell array, etc. In accordance with such property differences, word lines in a block are divided into some groups, and shifts are managed per group.

Assume that a block includes eighty-six word lines in the following description. In accordance with this example, the word lines are divided into, for example, three groups: a group of word lines 0 and 85 at both ends of the block, a group of word lines 1 and 84 second from the ends, and a group of word lines 2 to 83. FIG. 26 illustrates a first example of control tables of read level shifts according to the fifth embodiment. When data read with read level shifts estimated for a particular word line has its errors successfully corrected, the memory controller 3 stores the shifts for that word line. Then, it stores the values in the RAM 19 in the form of a table as illustrated in FIG. 26. The memory controller 3 stores such reusable shifts for each group. Furthermore, the memory controller 3 stores tables with the same structure for respective blocks. When read level shifts for a particular word line are necessary, the memory controller 3 refers to the tables to determine whether the values for the group to which that word line belongs are already estimated (or registered in the tables). When already estimated, the memory controller 3 uses the estimated shifts. This use of estimated shifts reduces a time to estimate shifts.

Word lines WL may be divided into more groups. For example, they are divided into ten groups of: the word line 0, the word line 1, the word lines 2 to 9, the word lines 10 to 22, the word lines 23 to 42, the word lines 43 to 62, the word lines 63 to 75, the word lines 76 to 83, the word line 84, and the word line 85.

Shifts for groups of word lines not at the ends of blocks may be independent for each block, and shifts of word lines at the ends of blocks may be calculated with an adjustment common to the blocks from the shifts for non-ends-word-line groups. FIG. 27 illustrates such an example and illustrates a second example of control tables of read level shifts according to the fifth embodiment. The lower part of FIG. 27 illustrates read level shifts for a non-ends-word-line (word lines 2 to 83) group for blocks of FIG. 26 collectively. The upper part illustrates adjustments of shifts of read levels for a group of word lines 0 and 85, and a group of word lines 1 and 84. These adjustments for ends-word-line groups are shared by all blocks. Specifically, shifts for an ends-word-line group of a particular block are determined by adding shifts for that block in the lower table and adjustments in the upper table. When word line dependencies of shifts are the same or substantially the same among blocks, using the FIG. 27 can reduce the size of tables from that of the FIG. 26 example.

Moreover, a stress type may be considered for a particular group. FIG. 28 illustrates such an example and illustrates a third example of control tables of read level shifts according to the fifth embodiment. The lower part of FIG. 28 is the same as that of FIG. 27. In contrast, the upper part is, unlike the upper part of FIG. 27, divided for adjustments for groups for each stress. Specifically, sets of adjustments for the DR stress, PD stress, and RD stress are defined for the group of word lines 0 and 85. Similarly, sets of adjustments for the DR stress, PD stress, and RD stress are defined for the group of word lines 1 and 84. For example, the memory controller 3 uses the FIG. 19 flow to determine the type of stress experienced by memory cells of shift estimation target and uses adjustments corresponding to the determined stress. Using the FIG. 28 example enables calculation of shifts that more accurately accord with the stress.

In the examples of FIGS. 26 to 28, only the group of word lines 0 and 85 and that of word lines 1 and 84 are exclusively managed. The embodiment is, however, not limited to this, and word lines exhibiting unique properties different from others in accordance with properties of the memory 2 are managed exclusively. Moreover, instead of collective management of a pair of word lines, one or three or more word lines may also be collectively managed. Moreover, the non-ends-word-line group may be divided into subgroups. For example, it is divided into subgroups of word lines 2 to 43, and that of word lines 44 to 83.

As described above, according to the fifth embodiment, read level shifts are shared by groups of word lines which exhibit the same properties. When read level shifts for a particular word line is necessary and values for the group to which that word line belongs are already available, they can be used. This results in a reduced time to estimate shifts.

Sixth Embodiment

As described above, depending on a change of a threshold voltage, a local minimum may not be the optimum read level shift. Experiments revealed that such an incorrectly-estimated read level shift tends to have a different shift from other read level shifts. They also revealed that a shift for a word line involved in incorrect estimation greatly differs from a shift of the corresponding read level of another word line. Therefore, consistency of related shifts is examined in the sixth embodiment.

The semiconductor memory device of the sixth embodiment has the same configuration as that of the first embodiment though the memory controller 3 of the sixth embodiments is configured to execute the following processes.

As described above, read level shifts generally correlate. Assume that, as a result of estimating all read level shifts through the distribution read as illustrated in the upper part of FIG. 29, B and D read level shifts are −18 DAC and −20 DAC, and the C read level shift is 25 DAC, for example. FIG. 29 illustrates examples of data obtained in a first example of read level shift estimation according to the sixth embodiment. The central and lower parts will be described later. The estimation that the C read level shift is 25 DAC (indicated by the enclosure) is highly likely to be erroneous. In order to detect and correct such incorrect estimation, the memory controller 3 executes the flow of FIG. 30, which is the flowchart of a first example of read level shift estimation according to the sixth embodiment.

In step S51, the memory controller 3 uses the distribution read to estimate all read level shifts. Examples of the estimated shifts are as illustrated in the upper part of FIG. 29.

For example, when the memory controller 3 fails in correcting errors of read data based on estimated shifts, it verifies the shifts by the following steps. Alternatively, the memory controller 3 verifies shifts by the following steps in every estimation step S51.

In steps after step S52, the memory controller 3 verifies estimated shifts. First, in step S52, the memory controller 3 calculates each read level shift from the estimated shift of adjacent read levels. Specifically, the shift of a particular read level is calculated as the average of the shifts of two read levels adjacent the read level currently examined. For example, the calculated C read level shift is the average (−19 DAC) of the B read level shift (−18 DAC) and D read level shift (−20 DAC). The shift of the maximum or minimum read level (for example, A read level) is substituted by the shift of the adjacent read level (for example, B level). An example result of the calculation is illustrated in the first row of the central part of FIG. 29.

In step S53, the memory controller 3 calculates, for each read level shift, the absolute difference of the estimated shift (illustrated in the upper part of FIG. 29), and the calculated shift (illustrated in the first row of the central part of FIG. 29). An example result of the calculation is illustrated in the second row of the central part of FIG. 29.

After step S54, the memory controller 3 searches for absolute differences which exceed a specified value and are successive in a specified number. Specifically, the memory controller 3 compares each absolute difference with the specified value to find a set of absolute differences which exceed the specified value and are successive in the specified number (for example, three) in the ascending order of the read level shift. Step S54, S55, S58 and S59 are mere examples for it. First, in step S54, the memory controller 3 sets a parameter i=0. i is zero to five in the example of eight data levels. i specifies the read level to be observed and i=0 to 5 correspond to A-E read levels, respectively.

In step S55, the memory controller 3 determines whether all absolute differences of i, i+1 and i+2 read levels exceed the specified value. In the FIG. 29 example, the set of absolute differences of B to D read levels fulfills the condition, and is indicated by the enclosure. When such a set is found, the flow proceeds to step S56. Finding such a set indicates that the estimated shift of the read level corresponding to the current i+1 (or the read level corresponding to the center of the set of three differences) is erroneous. Specifically, the C read level shift is erroneous, and therefore not only the absolute difference for the C read level but those for B and D read levels calculated with that erroneous value should be also large. In accordance with this characteristic, it is determined that the estimated shift corresponding to the absolute difference of the center of the set of absolute differences is erroneous.

Then, in step S56, the memory controller 3 replaces the estimated shift (25 DAC) of the read level corresponding to the current i+1 of FIG. 29 (for example, C read level) with the corresponding calculated shift (−19 DAC). The thus modified set of shifts is illustrated in the first row of the lower part of FIG. 29. For the remaining read levels, the estimated shifts (illustrated in the upper part of FIG. 29) are maintained.

In contrast, when the determination in step S55 is No, the memory controller 3 maintains the estimated shift (illustrated in the upper part of FIG. 29) (step S57).

Steps S56 and S57 continue to step S58, where the memory controller 3 determines whether the parameter i is the maximum. When it is the maximum, this means that the verification for all read levels has been completed. The flow then terminates. In contrast, with an unverified read level, the flow proceeds to step S59, where the memory controller 3 sets the parameter i=i+1, and the flow then returns to step S55. Using the parameter i and its one increment to verify read levels in step S54, S58 and S59 has been described; however, the embodiment is not limited to this and all verifications for necessary read levels can be executed in any order.

The lower part of FIG. 29 illustrates a result of re-verification based on the modified shifts for the purpose of reference. Specifically, it illustrates values calculated from the adjacent read level shifts and absolute differences of the calculated and estimated values based on the modified shifts similar to steps S52 and S53. It can be seen that the differences (see the third row of the lower part of FIG. 29) for read level shifts greatly decreased close to zero. In other words, it can be seen that the C read level shift was modified toward the correct value.

Figure 32:
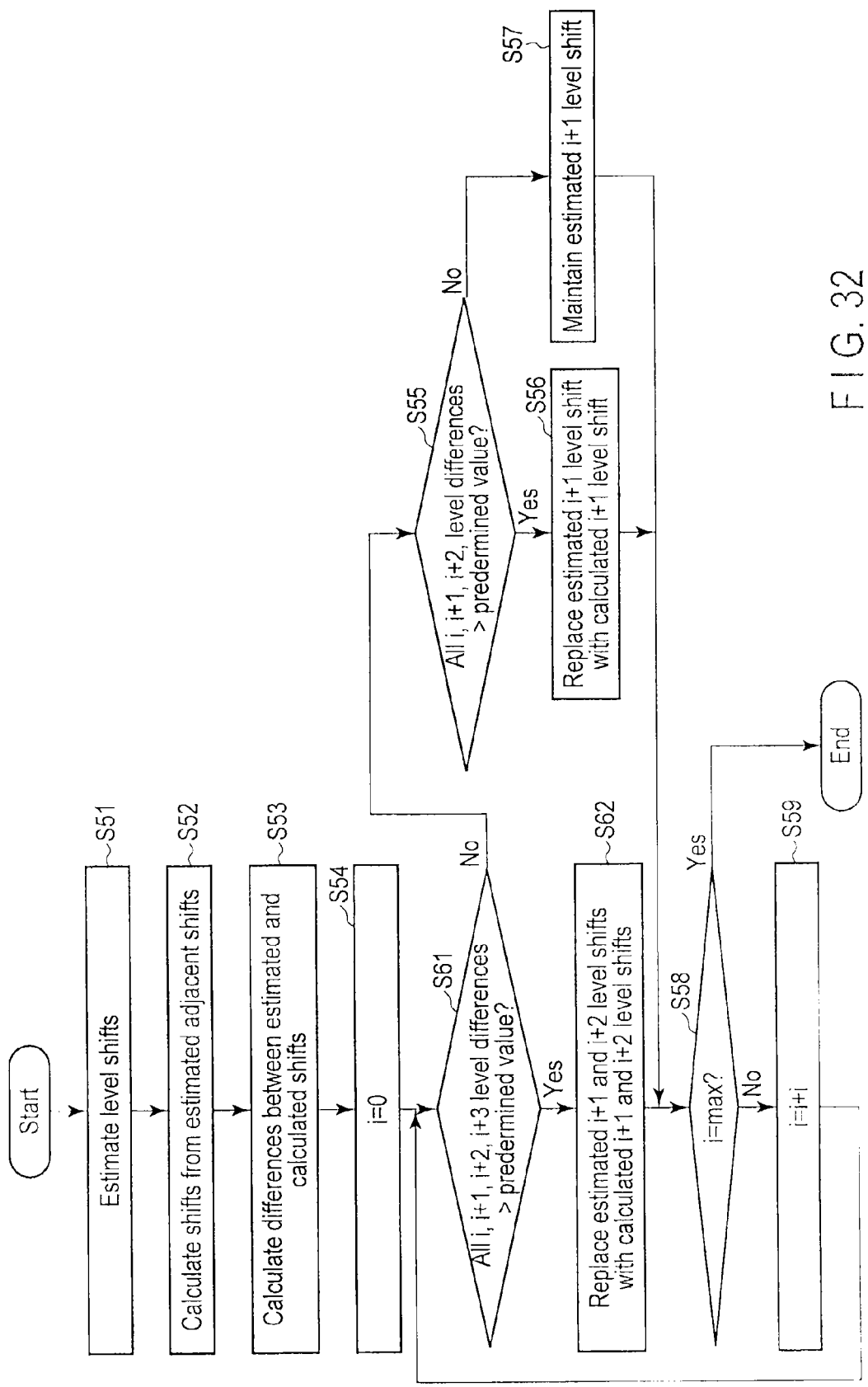
FIG. 32 is a flowchart of a second example of read level shift estimation according to the sixth embodiment.

Two successive estimated shifts may be erroneous. FIG. 31 illustrates such an example and illustrates examples of data obtained in a second example of read level shift estimation according to the sixth embodiment. Assume that estimated values of successive C and D read level shifts are 25 and 20 DAC as illustrated in the upper part of FIG. 31 (indicated by the enclosure). The central and lower parts will be described later. These values are highly likely to be erroneous. In order to detect and correct such incorrect estimation, the memory controller 3 executes the flow of FIG. 32, which is the flowchart of a second example of read level shift estimation according to the sixth embodiment.

Steps S51 to S53 are the same as those of the first example (FIG. 30). Step S53 continues to step S61. Examples of shifts estimated in step S51 are illustrated in the upper part of FIG. 31. Examples of shifts calculated in step S52 are illustrated in the first row of the central part of FIG. 31. Examples of absolute differences between the estimated shifts and calculated shifts obtained in step S53 are illustrated in the second row of the central part of FIG. 31.

After step S61, the memory controller 3 searches for four successive absolute differences which exceed a specified value, and when failed, it searches for three successive absolute differences which exceed the specified value. Specifically, the memory controller 3 compares each absolute difference with the specified value to find a set of four successive absolute differences exceeding the specified value in ascending order of the read level shift, and then finds a set of three successive absolute differences exceeding the specified value in ascending order of the read level shift. Steps S54, S55, S58 and S59 are mere examples for such. First, in step S54, the memory controller 3 sets the parameter i=0.

In step S61, the memory controller 3 determines whether all absolute differences of i, i+1, i+2 and i+3 read levels exceed the specified value. In the FIG. 31 example, the set of absolute differences of B to E read levels fulfills the condition, and is indicated by the enclosure. When such a set is found, the flow proceeds to step S62. Finding such a set indicates that the estimated shifts of the read levels corresponding to the current i+1 and i+2 (or the read level corresponding to the two middle ones of the set of four differences) are erroneous. Specifically, the C and D read level shifts are erroneous, and therefore not only the absolute differences for the C and D read levels but those for B and E read levels calculated with those erroneous values should be also large. In accordance with this character, it is determined that the estimated shifts corresponding to the absolute differences of the two middle ones of the set of absolute differences are erroneous. Then, in step S62, the memory controller 3 replaces the estimated shifts (25 and 20 DAC) of the read levels corresponding to the current i+1 and i+2 of FIG. 31 (for example, C and D read levels) with the average of its two adjacent estimated shifts (−18 and −18 DAC). Thus modified set of shifts is illustrated in the first row of the lower part of FIG. 31. For the remaining read levels, the estimated shifts (illustrated in the upper part of FIG. 31) are maintained.

In contrast, when the determination in step S61 is No, the flow proceeds to step S55. Step S55 continues to step S56 or step S57 as in FIG. 30. Steps S62, S56 and S57 continue to step S58. The flow terminates when all read levels are verified. With an unverified read level, the flow returns to step S61 through step S59.

The lower part of FIG. 31 illustrates a result of re-verification based on the modified shifts for the purpose of reference. It can be seen that the C and D read level shifts were modified toward the correct values as in the first example.

The estimated shift of the minimum or maximum read level may be erroneous. FIG. 33 illustrates such an example and illustrates examples of data obtained in a third example of read level shift estimation according to the sixth embodiment. Assume that an estimated shift of the G read level, which is the maximum, is −22 DAC as illustrated in the upper part of FIG. 33 (indicated by the enclosure). The central and lower parts will be described later. These values are highly likely to be erroneous. In order to detect and correct such incorrect estimation, the memory controller 3 executes the flow of FIG. 34, which is the flowchart of a third example of read level shift estimation according to the sixth embodiment.

Steps S51 to S53 are the same as those of the first example (FIG. 30). Step S53 continues to stop S71. Examples of shifts estimated in step S51 are illustrated in the upper part of FIG. 33. Examples of shifts calculated in step S52 are illustrated in the first row of the central part of FIG. 33. Examples of absolute differences between the estimated shifts and calculated shifts obtained in step S53 are illustrated in the second row of the central part of FIG. 33.

Figure 34:
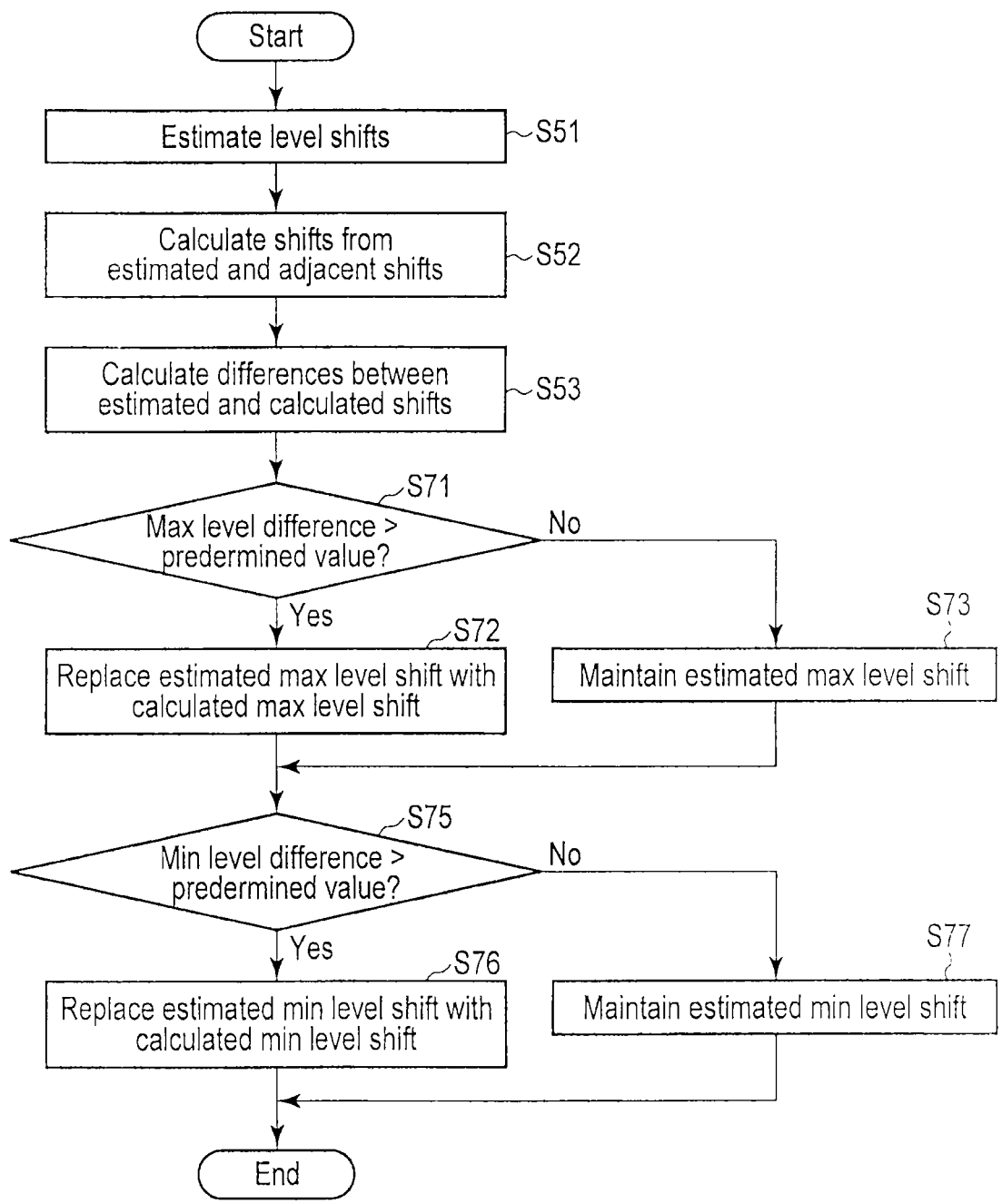
FIG. 34 is a flowchart of a third example of read level shift estimation according to the sixth embodiment.

After step S71, the memory controller 3 determines whether the shifts of the minimum and maximum read levels exceed a specified value. The order of determination is arbitrary. FIG. 34 illustrates an example of verification of the maximum read level shift preceding. In step S71, the memory controller 3 compares the absolute difference for the maximum read level with the specified value (for example, 12 DAC). In the FIG. 33 example, the absolute difference for the G read level fulfills this condition, and is indicated by the enclosure. When such a value is found, the flow proceeds to step S72. Finding such a value indicates that the estimated value of the corresponding read level shift is erroneous. Then, the memory controller 3 replaces the estimated shift of the maximum read level (−22 DAC) with the adjacent shift (2 DAC). The thus modified set of shifts is illustrated in the first row of the lower part of FIG. 33. For the remaining read levels, the estimated shifts (illustrated in the upper part of FIG. 33) are maintained.

In contrast, when the determination in step S71 is No, the memory controller 3 maintains the estimated shift of the maximum read level (step S73).

Steps S72 and S73 continue to step S75. Steps S75 to S77 are related with verification of the shift of the minimum read level, and are as essentially the same as steps S71 to S73 with the difference of the shift to be verified.

The lower part of FIG. 33 illustrates a result of re-verification based on the modified shifts for the purpose of reference. It can be seen that the G read level shift was modified toward the correct value as in the first example.

As described above, according to the sixth embodiment, an estimated shift about a particular read level is verified and corrected with an estimated shift for another read level. The verification detects an abnormal read level shift which is inconsistent with another read level shift. Furthermore, a detected abnormal read level shift is corrected with an adjacent read level shift. The thus corrected shift is more consistent with other shifts than the original value based on incorrect estimation. This raises the probability by which read data errors based on a corrected read level shift can be corrected, and reduces read errors.

Seventh Embodiment

The seventh embodiment is based on the first embodiment and uses the two systems together.

The semiconductor memory device of the seventh embodiment has the same configuration as that of the first embodiment though the memory controller 3 of the seventh embodiment is configured to execute the following processes.

Figure 35:
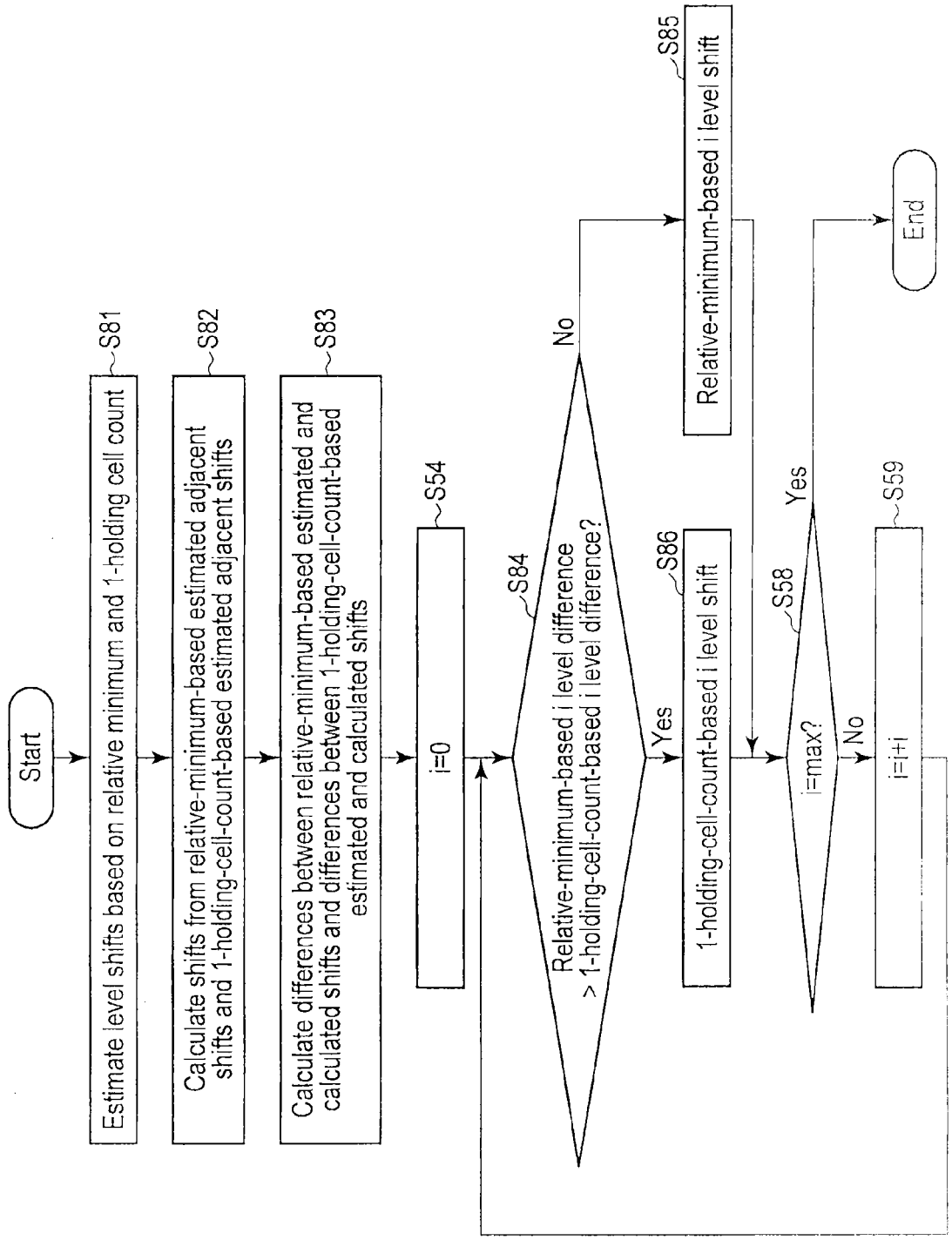
FIG. 35 is a flowchart of read level shift estimation according to a seventh embodiment.

Referring now to FIGS. 35 and 36, read level shift estimation according to the seventh embodiment will be described. FIG. 35 is the flowchart of read level shift estimation according to the seventh embodiment. FIG. 36 illustrates examples of data obtained in the read level shift estimation according to the seventh embodiment. As illustrated in FIG. 35, the memory controller 3 estimates shifts of read levels in accordance with the local minimum of threshold voltage distribution, and also in accordance with the counts of 1-data holding memory cells in accordance with the first embodiment (step S81). Example results of the estimation are illustrated in the upper part of FIG. 36. In this example, two estimated shifts for the A read level greatly differ, and at least one of them is highly likely to be erroneous.

The memory controller 3 executes the following steps in order to verify estimated read level shifts. First, in step S82, the memory controller 3 calculates a local-minimum-based shift of each read level from local-minimum-based estimated shifts of adjacent read levels as in step S52 of the sixth embodiment. Specifically, a local-minimum-based shift for a particular read level is calculated as the average of local-minimum-based shifts of two read levels adjacent that read level currently observed. Similarly, the memory controller 3 calculates a 1-holding-memory-count-based shift of each read level from the average of 1-holding-memory-count-based shifts of adjacent read levels. Calculation results are illustrated in the central part of FIG. 36.

In step S83, the memory controller 3 calculates, for each read level, an absolute difference between the local-minimum-based estimated shift (illustrated in the first row of the upper part of FIG. 36) and the calculated shift (illustrated in the first row of the central part of FIG. 36) as in step S53 of the sixth embodiment. Example results of the calculation are illustrated in the first row of the central part of FIG. 36. Similarly, the memory controller 3 calculates, for each read level, an absolute difference between the 1-holding-memory-count-based estimated shift (illustrated in the second row of the upper part of FIG. 36) and the calculated shift (illustrated in the second row of the central part of FIG. 36). Example results of the calculation are illustrated in the second row of the lower part of FIG. 36.

After step S54, the memory controller 3 selects, for each read level shift, a suitable one of the local-minimum-based difference and 1-holding-memory-count-based difference. Steps S54, S58 and S59 are mere examples for such. First, in step S54, the memory controller 3 sets the parameter i=0. Step S54 continues to step S84.

In step S84, the memory controller 3 compares, for the i read level shift, the local-minimum-based difference with the 1-holding-memory-count based difference. As a result of the comparison, the memory controller 3 selects a shift based on the smaller one of the differences. When the local-minimum-based difference is smaller, the memory controller 3 selects the local-minimum-based estimated shift for the i read level (illustrated in the first row of the upper part of FIG. 36) (step S85). In the shown example, the estimated values based on 1-holding-memory counts are selected for D to F read levels (indicated by the enclosure). In contrast, when the 1-holding-memory-count-based difference is smaller, the memory controller 3 selects the 1-holding-memory-count-based estimated shift for the i read level (illustrated in the second row of the upper part of FIG. 36) (step S86). In the shown example, the estimated values based on the local minimum are selected for A to C read levels. The results of the selection are illustrated in the third row of the lower part of FIG. 36. In the shown example, the two differences are equal for the G level. In such a case, either estimated value may be selected.

Steps S85 and S86 continue to step S58. The flow terminates after shifts for all read levels are selected. With an unselected read level, the flow returns to step S84 through step S59.

The selection from two shifts may be based on the following reference. As can be seen from FIG. 1 and the description above, when one of threshold voltage distributions for adjacent first and second data levels (for example, Er and A levels) has a long skirt and overlaps with the other, the local minimum near here is large. In contrast, when a skirt of a threshold voltage distribution for a particular data level is short and does not overlap with another threshold voltage distribution greatly, the local minimum near here is small. Then, in accordance with this observation, the local minimum is used as a reference.

FIG. 37 is the flowchart of a second example of read level shift estimation according to the seventh embodiment. The memory controller 3 executes step S81, proceeds to step S54, and then to step S91. In step S91, the memory controller 3 obtains the local minimum estimated as the shift of the i read level in step S81.

In step S92, the memory controller 3 determines whether the local minimum for the i read level exceeds a specified value. The specified value depends on the number of memory cells for which the distribution read is executed and the properties of the memory 2. For example, based on statistics and/or simulation, a value is selected which is not exceeded by the local minimum unless a threshold voltage distribution for a particular data level greatly overlaps with a threshold voltage distribution for another data level in accordance with the properties of shifts of threshold voltages of cell transistors. For example, with the object of the distribution read being 16 Kbytes, the specified value can be 240 bits. With the object of distribution read being 2 Kbytes, the specified value can be 30 bits.

When the determination in step S92 is No, the memory controller 3 selects the local-minimum-based estimated shift for the i read level (step S85). When the determination in step S92 is Yes, the memory controller 3 selects the 1-holding-memory-count-based estimated shift for the i read level (step S86).

Steps S85 and S86 continue to step S58. The flow terminates after shifts for all read levels are selected. With a read level with an unselected shift, the flow returns to step S91 through step S59.

As described above, according to the seventh embodiment, for each read level, shifts are estimated based on both the local minimum and 1-holding-memory count, and a suitable one of them is selected. Estimation based on the 1-holding memory-cell count presents more accurate results, even when estimation based on the local minimum presents less accurate results. This results in improved estimation accuracy of read level shifts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
memory cells each having a threshold voltage to distinguish a storage data item stored; and
a controller configured to:
generate one of different storage data items from one or more sets of reception data,
store the one of the different storage data items,
randomize data transmission for the memory cells,
transmit the randomized transmission data to the memory cells,
instruct the memory cells to store the randomized transmission data,
use read voltage candidates to read storage data from the memory cells,
count a distribution of voltages stored in the memory cells for each read voltage candidate,
specify a minimum one of read voltage candidates where a sum of the counting exceeds an expected number, and
use the specified read voltage candidate as a read voltage to distinguish a first storage data item of the storage data items corresponding to the expected number and an adjacent second storage data item.

2. The device of claim 1, wherein the expected number is an integral multiple of (a total number of bits stored by a first subset of the memory cells)/(the number of storage data items).

3. The device of claim 2, wherein:
the first storage data item is an $n^{th}$ (n being a natural number) from a minimum storage data item corresponding to a minimum threshold voltage toward a maximum storage data item corresponding to a maximum threshold voltage, and
the expected number is (a total number of bits stored by the first subset of the memory cells)/(the number of storage data items)×(n+1).

4. The device of claim 1, wherein the controller is configured, when the minimum read voltage candidate does not exceed a specified value, to use a local minimum of a distribution of a count of each read voltage candidate of the memory cells as a read voltage to distinguish the first and second storage data items.

5. The device of claim 1, wherein the controller is further configured to:
estimate a second read voltage to distinguish the first and second storage data items based on a local minimum of a distribution of voltages stored in the memory cells, and
use one of the specified read voltage candidate and the second read voltage as a read voltage to distinguish the first and second storage data items.

6. The device of claim 5, wherein the controller is further configured to select one of the specified read voltage candidate and the second read voltage using another read voltage.

7. The device of claim 6, wherein the controller is further configured to:
use the specifying of a minimum read voltage candidate where a sum of counts exceeds the expected number to estimate third and fourth read voltages to respectively determine storage data items adjacent the first storage data item,
calculate a first average of the third and fourth read voltages,
estimate fifth and sixth read voltages to respectively determine the adjacent storage data items in accordance with a local minimum of a distribution of voltages stored in the memory cells, calculate a second average of the fifth and sixth read voltages, and use the specified read voltage candidate as a read voltage to distinguish the first and second storage data items when the second average is smaller than the first average, and use the second read voltage otherwise.

8. A semiconductor memory device comprising:

memory cells each storing one of different storage data items and having a threshold voltage to distinguish a storage data item stored; and a first word line and a second word line coupled to the memory cells; and a controller configured to:
  determine respective threshold voltages of the memory cells using read voltages to determine a storage data item stored in each of the memory cells,
  determine a first read voltage to determine a first storage data item for the first word line based on a second read voltage to determine the first storage data item for the second word line.

9. The device of claim 8, wherein:

the device further comprises a third word line coupled to the memory cells, and the controller is further configured to determine the first read voltage based on the second read voltage and a third read voltage to determine the first storage data item for the third word line.

10. The device of claim 9, wherein the controller is further configured to use the average of the second and third read voltages weighted in accordance with a distance between the first word line and the second or third word line as the first read voltage.

11. The device of claim 9, wherein:

the memory device is configured to erase data per erase unit of the memory cells, and the first, second, and third word lines are coupled to respective subsets of memory cells in an erase unit.

12. The device of claim 11, wherein the memory device uses groups in each of which a common read voltage can be used, and is configured to use a common read voltage to determine the first storage data item within each group.

13. The device of claim 12, wherein the controller is configured to:

use a third read voltage to determine the first storage data item for word lines in a first erase unit except for word lines at both ends, use a fourth read voltage to determine the first storage data item for word lines in a second erase unit except for word lines at both ends, use the sum of the third read voltage and a first adjustment to determine the first storage data item for the word lines at both ends in the first erase unit, and use the sum of the fourth read voltage and the first adjustment to determine the first storage data item for word lines at both ends in the second erase unit.

14. The device of claim 13, wherein the first adjustment is based on a type of stress experienced by the memory cells.

15. A semiconductor memory device comprising:

memory cells each storing one of different storage data items and having a threshold voltage to distinguish a storage data item stored; and a controller configured to:
  estimate read voltages to determine respective threshold voltages of the memory cells, and
  when a first read voltage of the estimated read voltages is inconsistent with another read voltage, use said another voltage to correct the first read voltage.

16. The device of claim 15, wherein:

the read voltages further include second and third read voltages, the first, second, and third read voltages adjoin, and the controller is configured to:
  calculate a first difference between a first average of read voltages adjacent the first read voltage at both sides, and the first read voltage,
  calculate a second difference between a second average of read voltages adjacent the second read voltage at both sides, and the second read voltage,
  calculate a third difference between a third average of read voltages adjacent the third read voltage at both sides, and the third read voltage, and
  replace the estimated first read voltage with the first difference when all the first, second, and third differences exceed a specified value.

17. The device of claim 15, wherein:

the first read voltage is the maximum or minimum read voltage of the read voltages, and the controller is further configured to replace the estimated first read voltage with an estimated read voltage adjacent the estimated first read voltage when the estimated first read voltage is inconsistent with another read voltage.

18. The device of claim 15, wherein the controller is configured to:

estimate a first shift of a first read voltage from a default, estimate a second shift of a second read voltage from a default, and calculate a third read voltage from the first shift when a difference between the first and second shifts is small, and calculate the third read voltage from the second shift when a difference between the first and second shifts is large.

19. The device of claim 15, wherein the controller is further configured to:

obtain a first shift of the third read voltage from a default and a second shift of the fourth read voltage from a default, select one of formulas based on the first and second shifts, and use the selected formula to calculate a fifth read voltage.

20. The device of claim 19, wherein the controller is further configured to:

determine a type of stress experienced by the memory cells based on the first and second shifts, and use one of the formulas corresponding to the determined stress to calculate the fifth read voltage.

* * * * *